(12) United States Patent
GanapathiSubramanian et al.

(10) Patent No.: US 8,215,946 B2
(45) Date of Patent: Jul. 10, 2012

(54) IMPRINT LITHOGRAPHY SYSTEM AND METHOD

(75) Inventors: Mahadevan GanapathiSubramanian, Austin, TX (US); Byung-Jin Choi, Austin, TX (US); Mario Johannes Meissl, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 12/582,091

(22) Filed: Oct. 20, 2009

(65) Prior Publication Data
US 2010/0072652 A1    Mar. 25, 2010

Related U.S. Application Data

(63) Continuation-in-part of application No. 11/749,909, filed on May 17, 2007, now Pat. No. 7,641,840.

(60) Provisional application No. 61/107,729, filed on Oct. 23, 2008, provisional application No. 61/108,640, filed on Oct. 27, 2008, provisional application No. 60/801,265, filed on May 18, 2006, provisional application No. 60/827,128, filed on Sep. 27, 2006.

(51) Int. Cl.
  *B29D 11/00* (2006.01)
  *B29D 17/00* (2006.01)
  *B29C 59/02* (2006.01)

(52) U.S. Cl. ........ 425/400; 425/375; 425/385; 425/389; 425/394; 425/405.1

(58) Field of Classification Search ................. 425/150, 425/375, 383, 385, 389, 394, 396, 400, 402, 425/405.1, 409, 419
See application file for complete search history.

(56) References Cited

U.S. PATENT DOCUMENTS

| | | | |
|---|---|---|---|
| 3,637,381 A | 1/1972 | Hallman et al. | |
| 3,997,447 A | 12/1976 | Breton et al. | |
| 4,119,688 A | 10/1978 | Hiraoka | |
| 4,233,261 A | 11/1980 | Mijnheer | |
| 4,279,628 A | 7/1981 | Wymer et al. | |
| 4,312,823 A | 1/1982 | Kraakman | |
| 4,395,211 A * | 7/1983 | Broeksema et al. | 425/174.4 |
| 4,475,223 A | 10/1984 | Taniguchi et al. | |
| 4,506,184 A * | 3/1985 | Siddall | 310/328 |
| 4,512,848 A | 4/1985 | Deckman et al. | |
| 4,521,175 A | 6/1985 | Medwed | |
| 4,551,192 A | 11/1985 | DiMilia et al. | |
| 4,559,717 A | 12/1985 | Scire et al. | |
| 4,689,004 A | 8/1987 | Hunkel | |

(Continued)

FOREIGN PATENT DOCUMENTS

EP    1072954    5/2002

(Continued)

OTHER PUBLICATIONS

Feynman, There's Plenty of Room at the Bottom, Dec. 1, 1959.

(Continued)

*Primary Examiner* — Joseph Del Sole
*Assistant Examiner* — Seyed Masoud Malekzadeh
(74) *Attorney, Agent, or Firm* — Cameron A. King

(57) ABSTRACT

System, method and process for imprinting a substrate using controlled deformation of a substrate and/or a template. The substrate and/or template may be positioned in single wave formation or double wave formation during an imprint lithography process.

16 Claims, 18 Drawing Sheets

U.S. PATENT DOCUMENTS

| | | |
|---|---|---|
| 4,724,222 A | 2/1988 | Feldman |
| 4,731,155 A | 3/1988 | Napoli et al. |
| 4,767,584 A | 8/1988 | Siler |
| 4,887,282 A * | 12/1989 | Mueller .......................... 378/34 |
| 5,028,361 A | 7/1991 | Fujimoto |
| 5,028,366 A | 7/1991 | Harakal et al. |
| 5,029,418 A * | 7/1991 | Bull ................................ 451/41 |
| 5,213,600 A | 5/1993 | Greschner |
| 5,259,926 A | 11/1993 | Kuwabara et al. |
| 5,324,012 A | 6/1994 | Aoyama et al. |
| 5,331,371 A | 7/1994 | Mori et al. |
| 5,338,177 A | 8/1994 | Le Touche |
| 5,364,222 A | 11/1994 | Akimoto et al. |
| 5,374,829 A * | 12/1994 | Sakamoto et al. ....... 250/453.11 |
| 5,425,848 A | 6/1995 | Haisma et al. |
| 5,427,599 A | 6/1995 | Greschner et al. |
| 5,512,131 A | 4/1996 | Kumar et al. |
| 5,515,167 A | 5/1996 | Ledger et al. |
| 5,527,662 A | 6/1996 | Hashimoto et al. |
| 5,534,073 A | 7/1996 | Kinoshita et al. |
| 5,545,367 A | 8/1996 | Bae et al. |
| 5,550,654 A | 8/1996 | Erdogan et al. |
| 5,563,684 A | 10/1996 | Stagaman |
| 5,601,641 A | 2/1997 | Stephens |
| 5,669,303 A | 9/1997 | Maracas et al. |
| 5,675,403 A * | 10/1997 | Cerrina et al. .................. 355/75 |
| 5,737,064 A | 4/1998 | Inoue et al. |
| 5,772,905 A | 6/1998 | Chou |
| 5,776,748 A | 7/1998 | Singhvi et al. |
| 5,804,089 A | 9/1998 | Suzuki et al. |
| 5,820,769 A | 10/1998 | Chou |
| 5,821,175 A | 10/1998 | Engelsberg |
| 5,849,209 A | 12/1998 | Kindt-Larsen et al. |
| 5,849,222 A | 12/1998 | Jen et al. |
| 5,888,120 A * | 3/1999 | Doran ............................. 451/41 |
| 5,900,062 A | 5/1999 | Loewenhardt et al. |
| 5,923,408 A | 7/1999 | Takabayashi |
| 5,932,045 A * | 8/1999 | Campbell et al. ............. 156/102 |
| 5,947,027 A | 9/1999 | Burgin et al. |
| 5,948,470 A | 9/1999 | Harrison et al. |
| 5,956,216 A | 9/1999 | Chou |
| 5,997,963 A | 12/1999 | Davison et al. |
| 6,019,166 A | 2/2000 | Viswanath et al. |
| 6,030,275 A * | 2/2000 | Lofaro ............................. 451/5 |
| 6,032,506 A | 3/2000 | Kergen |
| 6,099,771 A | 8/2000 | Hudkins et al. |
| 6,137,562 A | 10/2000 | Masuyuki et al. |
| 6,159,400 A | 12/2000 | Laquer |
| 6,160,430 A | 12/2000 | Drapkin et al. |
| 6,182,510 B1 | 2/2001 | Stanke et al. |
| 6,218,316 B1 | 4/2001 | Marsh |
| 6,220,561 B1 | 4/2001 | Garcia |
| 6,247,579 B1 | 6/2001 | Fujiyama et al. |
| 6,257,866 B1 | 7/2001 | Fritz et al. |
| 6,304,424 B1 | 10/2001 | Mett et al. |
| 6,305,677 B1 | 10/2001 | Lenz |
| 6,309,580 B1 | 10/2001 | Chou |
| 6,313,567 B1 | 11/2001 | Maltabes et al. |
| 6,334,960 B1 | 1/2002 | Willson et al. |
| 6,355,198 B1 | 3/2002 | Kim et al. |
| 6,383,890 B2 | 5/2002 | Takisawa et al. |
| 6,391,217 B2 | 5/2002 | Schaffer et al. |
| 6,407,006 B1 | 6/2002 | Levert et al. |
| 6,416,311 B1 | 7/2002 | Springer et al. |
| 6,461,524 B1 | 10/2002 | Tsuihiji et al. |
| 6,482,742 B1 | 11/2002 | Chou |
| 6,512,401 B2 | 1/2003 | Clark et al. |
| 6,513,796 B2 * | 2/2003 | Leidy et al. ..................... 269/21 |
| 6,517,995 B1 | 2/2003 | Jacobson et al. |
| 6,518,189 B1 | 2/2003 | Chou |
| 6,538,733 B2 * | 3/2003 | Gaal et al. ..................... 356/244 |
| 6,580,172 B2 | 6/2003 | Mancini et al. |
| 6,612,590 B2 | 9/2003 | Coomer et al. |
| 6,646,662 B1 | 11/2003 | Nebashi et al. |
| 6,696,220 B2 | 2/2004 | Bailey et al. |
| 6,713,238 B1 | 3/2004 | Chou et al. |
| 6,726,195 B1 | 4/2004 | Hertz et al. |
| 6,736,408 B2 | 5/2004 | Olgado et al. |
| 6,764,386 B2 | 7/2004 | Uziel |
| 6,771,372 B1 | 8/2004 | Traber |
| 6,776,094 B1 | 8/2004 | Whitesides et al. |
| 6,809,356 B2 | 10/2004 | Chou |
| 6,809,802 B1 * | 10/2004 | Tsukamoto et al. ............. 355/72 |
| 6,828,244 B2 | 12/2004 | Chou |
| 6,842,229 B2 | 1/2005 | Sreenivasan et al. |
| 6,849,558 B2 | 2/2005 | Schaper |
| 6,869,890 B2 | 3/2005 | Noji et al. |
| 6,870,301 B2 | 3/2005 | Choi et al. |
| 6,871,558 B2 | 3/2005 | Choi et al. |
| 6,898,064 B1 | 5/2005 | Berman et al. |
| 6,900,881 B2 | 5/2005 | Sreenivasan et al. |
| 6,908,861 B2 | 6/2005 | Sreenivasan et al. |
| 6,916,584 B2 | 7/2005 | Sreenivasan et al. |
| 6,916,585 B2 | 7/2005 | Sreenivasan et al. |
| 6,926,929 B2 | 8/2005 | Watts et al. |
| 6,932,934 B2 | 8/2005 | Choi et al. |
| 6,951,173 B1 | 10/2005 | Meissl et al. |
| 6,954,275 B2 | 10/2005 | Choi et al. |
| 6,965,506 B2 | 11/2005 | Howald |
| 6,980,282 B2 | 12/2005 | Choi et al. |
| 6,982,783 B2 | 1/2006 | Choi et al. |
| 6,990,870 B2 | 1/2006 | Choi et al. |
| 7,018,572 B2 | 3/2006 | Feist et al. |
| 7,019,819 B2 | 3/2006 | Choi et al. |
| 7,023,238 B1 | 4/2006 | Camarota |
| 7,036,389 B2 | 5/2006 | Choi et al. |
| 7,070,405 B2 | 7/2006 | Sreenivasan et al. |
| 7,071,088 B2 | 7/2006 | Watts et al. |
| 7,077,992 B2 | 7/2006 | Sreenivasan et al. |
| 7,090,716 B2 | 8/2006 | McMackin et al. |
| 7,119,884 B2 * | 10/2006 | Ottens et al. ..................... 355/72 |
| 7,144,539 B2 | 12/2006 | Olsson |
| 7,150,622 B2 | 12/2006 | Choi et al. |
| 7,179,079 B2 | 2/2007 | Sreenivasan et al. |
| 7,224,443 B2 | 5/2007 | Choi et al. |
| 7,244,386 B2 | 7/2007 | Sreenivasan et al. |
| 7,245,358 B2 | 7/2007 | Nimmakayala et al. |
| 7,252,715 B2 | 8/2007 | Watts et al. |
| 7,259,833 B2 | 8/2007 | Nimmakayala et al. |
| 7,270,533 B2 | 9/2007 | McMackin et al. |
| 7,281,919 B2 | 10/2007 | Shackleton et al. |
| 7,292,426 B2 * | 11/2007 | Ito et al. ........................ 361/234 |
| 7,298,456 B2 | 11/2007 | Cherala et al. |
| 7,307,697 B2 | 12/2007 | GanapathiSubramanian et al. |
| 7,316,554 B2 | 1/2008 | Choi et al. |
| 7,338,275 B2 | 3/2008 | Choi et al. |
| 7,462,028 B2 | 12/2008 | Cherala et al. |
| 7,473,090 B2 | 1/2009 | McMackin et al. |
| 7,635,263 B2 * | 12/2009 | Cherala et al. ................ 425/385 |
| 7,636,999 B2 * | 12/2009 | Choi et al. ....................... 29/559 |
| 7,641,840 B2 | 1/2010 | Choi et al. |
| 7,670,529 B2 * | 3/2010 | Choi et al. .................... 264/293 |
| 7,780,893 B2 | 8/2010 | Sreenivasan et al. |
| 2002/0018190 A1 | 2/2002 | Nogawa et al. |
| 2002/0042027 A1 | 4/2002 | Chou et al. |
| 2002/0069525 A1 | 6/2002 | Hada et al. |
| 2002/0094496 A1 | 7/2002 | Choi et al. |
| 2002/0132482 A1 | 9/2002 | Chou |
| 2002/0150398 A1 | 10/2002 | Choi et al. |
| 2002/0167117 A1 | 11/2002 | Chou |
| 2003/0034329 A1 | 2/2003 | Chou |
| 2003/0062334 A1 | 4/2003 | Lee et al. |
| 2003/0080471 A1 | 5/2003 | Chou |
| 2003/0080472 A1 | 5/2003 | Chou |
| 2003/0092261 A1 | 5/2003 | Kondo et al. |
| 2003/0179354 A1 | 9/2003 | Araki et al. |
| 2003/0189273 A1 | 10/2003 | Ollson |
| 2004/0029041 A1 | 2/2004 | Shih et al. |
| 2004/0036201 A1 | 2/2004 | Chou et al. |
| 2004/0036850 A1 | 2/2004 | Tsukamoto et al. |
| 2004/0046288 A1 | 3/2004 | Chou |
| 2004/0110856 A1 | 6/2004 | Young et al. |
| 2004/0118809 A1 | 6/2004 | Chou et al. |
| 2004/0129293 A1 | 7/2004 | Eichenberger |
| 2004/0131718 A1 | 7/2004 | Chou et al. |
| 2004/0132301 A1 | 7/2004 | Harper et al. |
| 2004/0137734 A1 | 7/2004 | Chou et al. |

| | | | |
|---|---|---|---|
| 2004/0141163 | A1 | 7/2004 | Bailey et al. |
| 2004/0156108 | A1 | 8/2004 | Chou et al. |
| 2004/0163563 | A1 | 8/2004 | Sreenivasan et al. |
| 2004/0192041 | A1 | 9/2004 | Jeong et al. |
| 2004/0197712 | A1 | 10/2004 | Jacobson et al. |
| 2004/0197843 | A1 | 10/2004 | Chou et al. |
| 2004/0250945 | A1 | 12/2004 | Zheng et al. |
| 2005/0037143 | A1 | 2/2005 | Chou et al. |
| 2005/0046449 | A1 | 3/2005 | Davis |
| 2005/0061773 | A1 | 3/2005 | Choi et al. |
| 2005/0064054 | A1* | 3/2005 | Kasumi ............ 425/112 |
| 2005/0072757 | A1 | 4/2005 | McMackin et al. |
| 2005/0106321 | A1 | 5/2005 | McMackin et al. |
| 2005/0189676 | A1 | 9/2005 | Sreenivasan |
| 2005/0236739 | A1 | 10/2005 | Willson et al. |
| 2005/0270312 | A1 | 12/2005 | Lad et al. |
| 2005/0274693 | A1 | 12/2005 | Heidari et al. |
| 2005/0276919 | A1 | 12/2005 | Truskett et al. |
| 2006/0063112 | A1 | 3/2006 | Sreenivasan |
| 2006/0076717 | A1 | 4/2006 | Sreenivasan et al. |
| 2006/0077374 | A1 | 4/2006 | Sreenivasan et al. |
| 2006/0115999 | A1 | 6/2006 | Sreenivasan et al. |
| 2006/0121728 | A1 | 6/2006 | McMackin et al. |
| 2006/0172031 | A1* | 8/2006 | Babbs et al. ............ 425/385 |
| 2006/0172549 | A1* | 8/2006 | Choi et al. ............ 438/758 |
| 2006/0172553 | A1* | 8/2006 | Choi et al. ............ 438/780 |
| 2006/0177532 | A1 | 8/2006 | Fletcher et al. |
| 2006/0177535 | A1 | 8/2006 | McMackin et al. |
| 2007/0063384 | A1 | 3/2007 | Choi et al. |
| 2007/0114686 | A1 | 5/2007 | Choi et al. |
| 2007/0126150 | A1 | 6/2007 | GanapathiSubramanian et al. |
| 2007/0132152 | A1 | 6/2007 | Choi et al. |
| 2007/0141271 | A1 | 6/2007 | Xu et al. |
| 2007/0170617 | A1 | 7/2007 | Choi et al. |
| 2007/0190200 | A1 | 8/2007 | Cherala et al. |
| 2007/0228593 | A1 | 10/2007 | Jones et al. |
| 2007/0228608 | A1 | 10/2007 | Shackleton et al. |
| 2007/0231422 | A1 | 10/2007 | Cherala et al. |
| 2007/0287081 | A1 | 12/2007 | Cherala et al. |
| 2008/0141862 | A1 | 6/2008 | Xu et al. |
| 2008/0153312 | A1 | 6/2008 | Sreenivasan et al. |
| 2008/0174046 | A1 | 7/2008 | Choi et al. |
| 2008/0199816 | A1 | 8/2008 | Choi et al. |
| 2008/0204693 | A1 | 8/2008 | Nimmakayala et al. |
| 2008/0303187 | A1 | 12/2008 | Stacey et al. |
| 2009/0014917 | A1 | 1/2009 | Hodge et al. |
| 2009/0115110 | A1 | 5/2009 | Schumaker |
| 2009/0148619 | A1 | 6/2009 | LaBrake et al. |
| 2010/0112220 | A1 | 5/2010 | Hodge et al. |

FOREIGN PATENT DOCUMENTS

| | | |
|---|---|---|
| JP | 57-032629 | 2/1982 |
| JP | 57-153434 | 9/1982 |
| JP | 60-127935 | 7/1985 |
| JP | 1-196749 | 8/1989 |
| JP | 02-24848 | 1/1990 |
| JP | 02-92603 | 4/1990 |
| JP | 02192045 | 7/1990 |
| JP | 4-148549 | 5/1992 |
| WO | WO 87/02935 | 5/1987 |
| WO | WO 97/05608 | 2/1997 |
| WO | WO 99/05724 | 2/1999 |
| WO | WO 00/21689 | 4/2000 |
| WO | WO 01/47003 | 6/2001 |
| WO | WO 2007/067469 | 6/2007 |
| WO | WO 2007/136832 | 11/2007 |

OTHER PUBLICATIONS

Johnson et al., Advances in Step and Flash Imprint Lithography, SPIE Microlithography Conference Feb. 23, 2003.
Chou et al., Lithographically Induced Self-assembly of Periodic Polymer Micropillar Arrays, J. Vac. Sci. Technol. B 17 (6), pp. 3197-3202 Nov. 1, 1999.
Colburn et al., Step and Flash Imprint Lithography: A New Approach to High-Resolution Patterning, Proc. of SPIE, vol. 3676 Mar. 1, 1999.
Chou, Nanoimprint Lithography and Lithographically Induced Self-Assembly, MRS Bulletin, pp. 512-517 Jul. 1, 2001.
Choi et al., Design of Orientation Stages for Step and Flash Imprint Lithography, Precision Engineering, pp. 192-199 Jan. 1, 2001.
Xia et al., Soft Lithography, Angew. Chem. Int. Ed., pp. 550-575 Jan. 1, 1998.
Chou et al., Imprint Lithography with Sub-10 nm Feature Size and High Throughput, Microelectronic Engineering 35, pp. 237-240 Jan. 1, 1997.
Haisma et al., Mold-assisted Nanolithography: A Process for Reliable Pattern Replication, J. Vac. Sci. Technol. B, pp. 4124-4128 Nov. 1, 1996.
Feldman, Wafer Chuck for Magnification Correction in X-ray Lithography, J. Vac. Sci. Technol. B 16(6), pp. 3476-3479 Nov. 1, 1998.
Chou et al., Imprint of Sub-25 nm Vias and Trenches in Polymers, Appl. Phys. Lett. 67 (21) Nov. 20, 1995.
Nguyen, Asymmetric Fluid-Structure Dynamics in Nanoscale Imprint Lithography, The University of Texas at Austin, pp. 1-111 Aug. 1, 2001.
Colburn et al., Step and Flash Imprint Lithography for sub-100 nm Patterning, Proceedings of SPIE vol. 3997, pp. 453-457 Jan. 1, 2000.
Chou et al., Imprint Lithography with 25-Nanometer Resolution, Science vol. 272, pp. 85-87 Apr. 5, 1996.
Heidari, Nanoimprint Lithography at the 6 in. Wafer Scale, J. Vac. Sci. Technol. B 18(6), pp. 3557-3560 Nov. 1, 2000.
Abstract of Japanese Patent 02-92603, Aug. 12, 2004.
Translation of Japanese Patent 02-92603, Apr. 3, 1990.
Translation of Japanese Patent 02-24848, Jan. 26, 1990.
Abstract of Japanese Patent 02-24848, Jan. 26, 1990.
Chou et al., Ultrafast and Direct Imprint of Nanostructures in Silicon, Nature, col. 417, (Jun. 2002), pp. 835-837 Jun. 1, 2002.
Chou et al., Nanoimprint Lithography, Journal of Vacuum Science Technolgoy B 14(16), pp. 4129-4133 Nov. 1, 1996.
Colburn et al., Development and Advantages of Step-and-Flash Lithography, Solid State Technology Jul. 1, 2001.
Colburn et al., Characterization and Modeling of Volumetric and Mechanical Properties for Step and Flash Imprint Lithography Photopolymers, Journal of Vacuum Science Technology. vol. b. 19(6) Nov. 1, 2001.
Bailey et al., Step and Flash Imprint Lithography: Defect Analysis, Journal of Vacuum Science, B 19(6), pp. 2806-2810 Nov. 1, 2001.
Bailey et al., Step and Flash Imprint Lithography: Template Surface Treatment and Defect Analysis, Journal of Vacuum Science, B 18(6), pp. 3572-3577 Nov. 1, 2000.
Schneider et al., Stripes of Partially Fluorinated Alkyl Chains: Dipolar Langmuir Monolayers, J. Chem. Phys. vol. 122, Issue 9 Mar. 1, 2005.
Colburn, Dissertation for the Degree of Doctor of Philosophy, Step and Flash Imprint Lithography: A Low-Pressure, Room-Temperature Nanoimprint Lithography Aug. 1, 2001.
Abstract of Japanese Patent 4-148549, May 21, 1992.
Abstract of Japanese Patent 60-127935, Jul. 8, 1985.
Abstract of Japanese Patent 57-153434, Sep. 22, 1982.
Abstract of Japanese Patent 57-032629, Feb. 22, 1982.

* cited by examiner

IMPRINT LITHOGRAPHY SYSTEM AND METHOD

CROSS-REFERENCE TO RELATED APPLICATIONS

This application claims the benefit under 35 U.S.C. §119(e)(1) of U.S. Provisional Patent Application No. 61/107,729 filed Oct. 23, 2008, and U.S. Provisional Patent Application No. 61/108,640 filed Oct. 27, 2008; both of which are hereby incorporated by reference herein in their entirety.

This application is also a continuation-in-part of U.S. Ser. No. 11/749,909, filed May 17, 2007, now issued as U.S. Pat. No. 7,641,840 on Jan. 5, 2010, which claims priority to U.S. Provisional Patent Application No. 60/801,265, filed May 18, 2006, and U.S. Provisional Patent Application No. 60/827,128 filed Sep. 27, 2006, all of which are hereby incorporated by reference herein in their entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields, while increasing the circuits per unit area formed on a substrate; therefore, nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference.

An imprint lithography technique disclosed in each of the aforementioned U.S. patent publications and patent includes formation of a relief pattern in a polymerizable layer and transferring a pattern corresponding to the relief pattern into an underlying substrate. The substrate may be coupled to a motion stage to obtain a desired positioning to facilitate the patterning process. Additionally, the substrate may be coupled to a substrate chuck. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
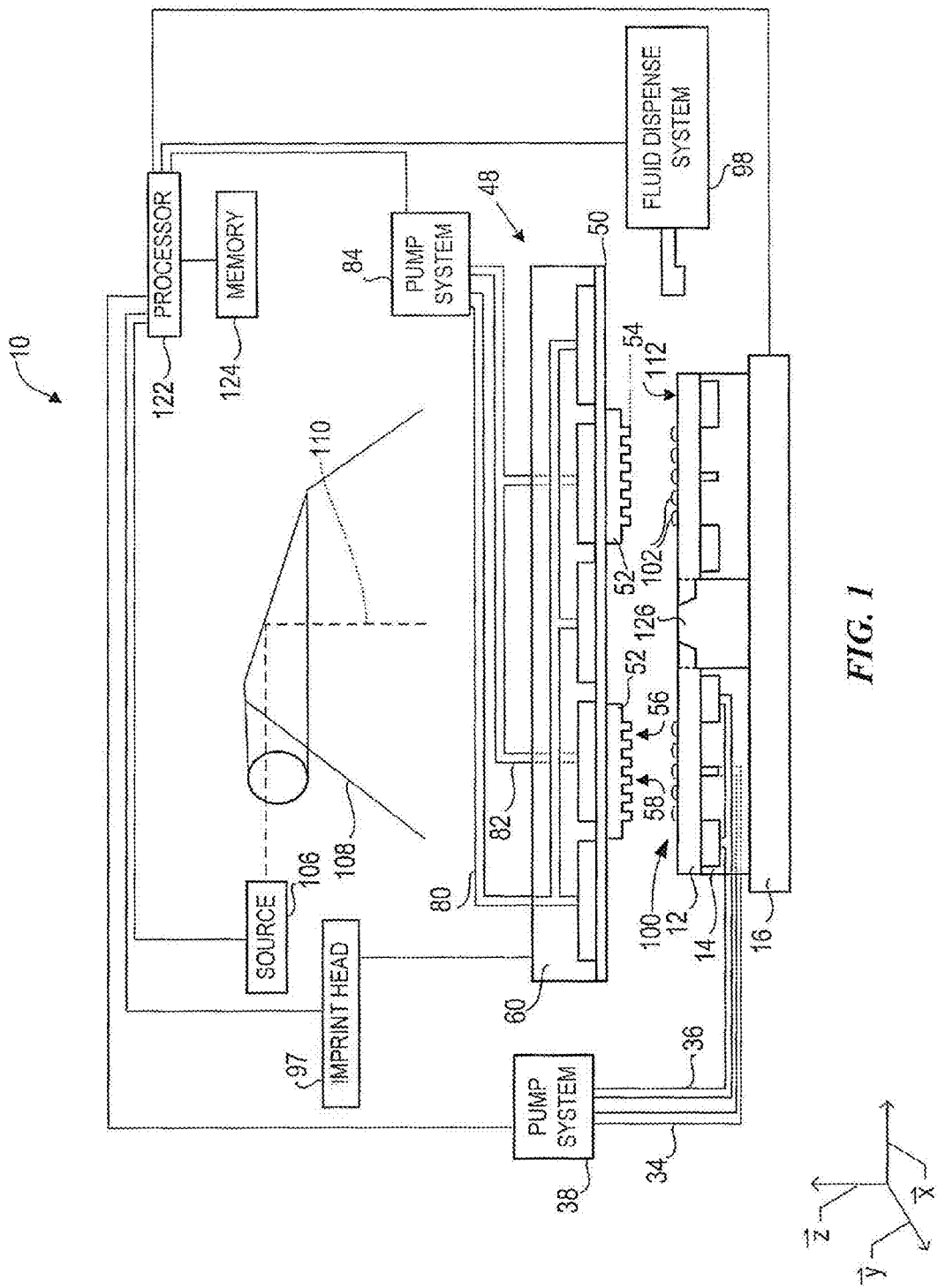
FIG. 1 is a simplified side view of a lithographic system having a patterning device spaced-apart from a substrate, the patterning device comprising a template and a mold.
Figure 2:
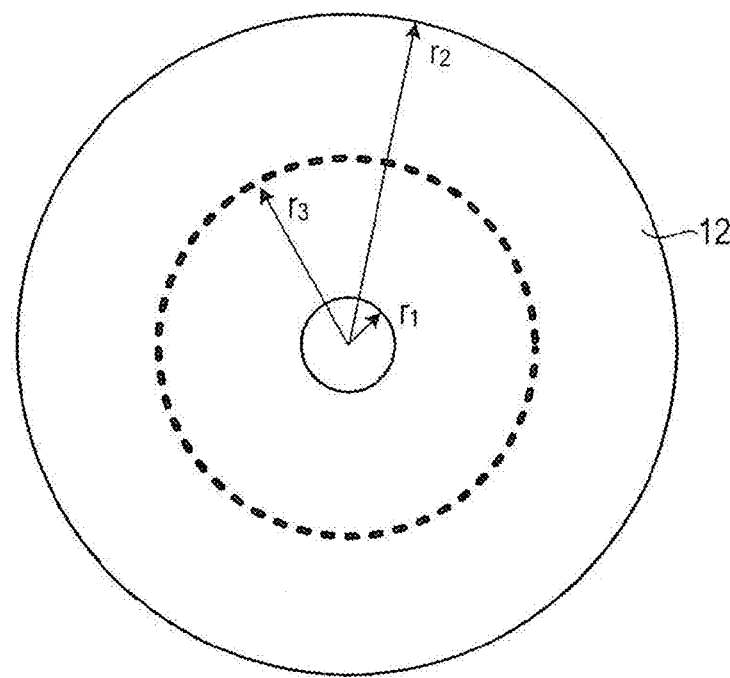
FIG. 2 is a top down view of the substrate shown in FIG. 1, the substrate having an inner, middle, and outer radius.

Referring to FIGS. 1 and 2, a system 10 to form a relief pattern on a substrate 12 is shown. Substrate 12 may have circular shape; however, in a further embodiment, substrate 12 may have any geometric shape. In the present example, substrate 12 may have a disk shape having an inner radius $r_1$ and outer radius $r_2$, with radius $r_2$ being greater than radius $r_1$. Further, defined between inner radius $r_1$ and outer radius $r_2$ is a middle radius $r_3$, with middle radius r3 positioned substantially equidistant from inner radius $r_1$ and outer radius $r_2$.

Figure 3:
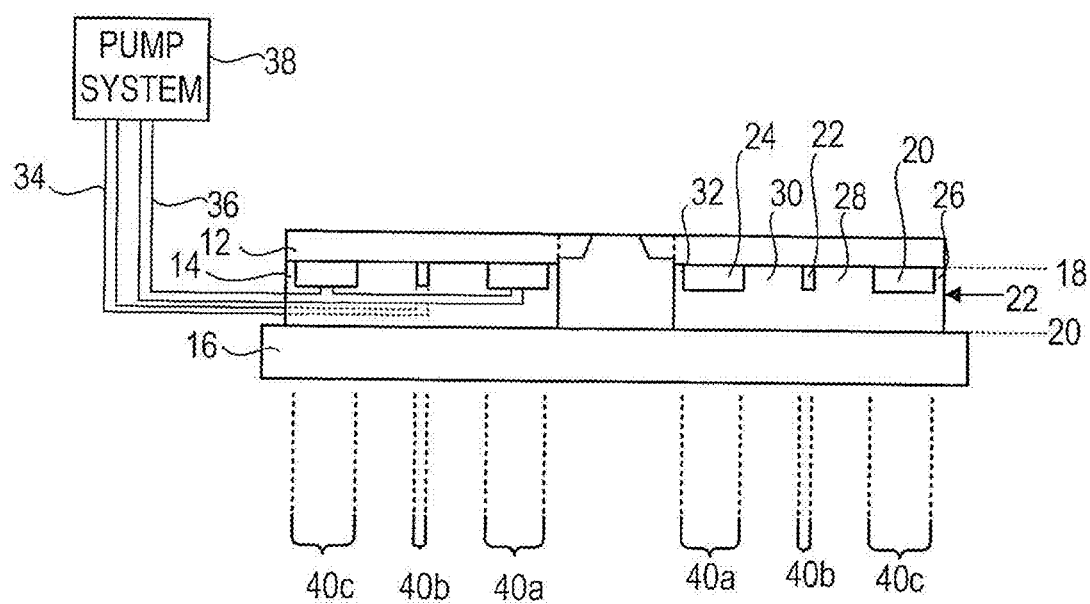
FIG. 3 is a side view of the substrate shown in FIG. 1 coupled to a substrate chuck.
Figure 4:
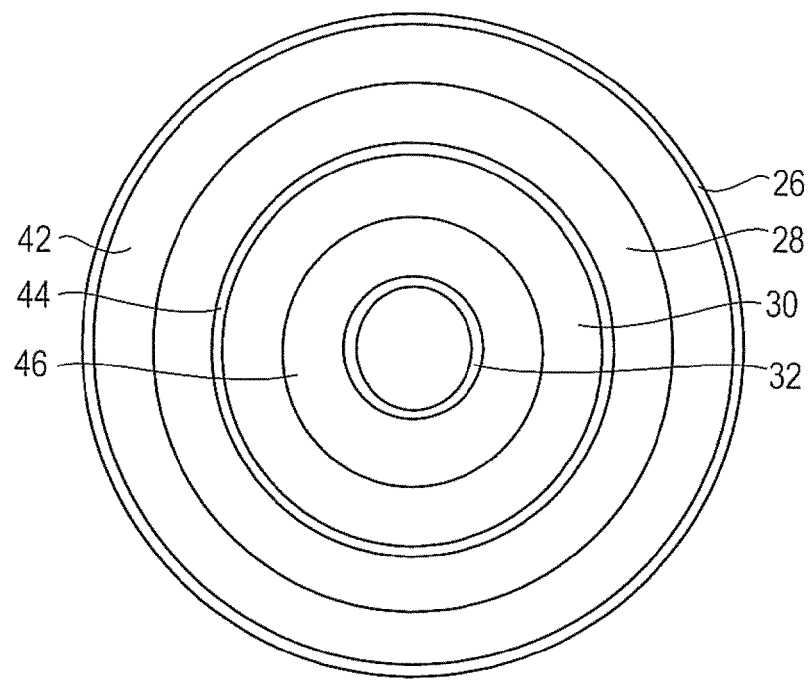
FIG. 4 is a bottom-up plan view of the substrate chuck shown in FIG. 3

Referring to FIG. 1, substrate 12 may be coupled to a substrate chuck 14. As shown substrate chuck 14 is a vacuum chuck, however, substrate chuck 14 may be any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes," which is incorporated herein by reference. Substrate 12 and substrate chuck 14 may be supported upon a stage 16. Further, substrate 12, substrate chuck 14, and stage 16 may be positioned on a base (not shown). Stage 16 may provide motion about a first and a second axis, with the first and the second axis being orthogonal to one another, i.e., the x and y axes. Referring to FIGS. 1, 3, and 4, substrate chuck 14 includes first 18 and second 20 opposed sides. A side, or edge, surface 22 extends between first side 18 and second side 20. First side 18 includes a first recess 20, a second recess 22, and a third recess 24, defining first 26, second 28, third 30, and fourth 32 spaced-apart support regions. First support region 26 cinctures second 28, third 30, and fourth 32 support regions and first 20, second 22, and third 24 recesses. Second support region 28 cinctures third 30 and fourth 32 support regions and second 22 and third 24 recesses. Third support region 30 cinctures fourth support region 32 and third recess 24. Third recess 24 cinctures fourth support region 32. In a further embodiment, first 26, second 28, third 30, and fourth 32 support regions may be formed from a compliant material. First 26, second 28, third 30, and fourth 32 support regions may have a circular shape; however, in a further embodiment, first 26, second 28, third 30, and fourth 32 may comprise any geometric shape desired.

Formed in substrate chuck 14 are throughways 34 and 36, however, substrate chuck 12 may comprise any number of throughways. Throughway 34 places first and third recesses 20 and 24 in fluid communication with side surface 18, however, in a further embodiment, it should be understood that throughway 34 may place first and third recesses 20 and 24 in fluid communication with any surface of substrate chuck 14. Throughway 36 places second recess 22 in fluid communication with side surface 18, however, in a further embodiment, it should be understood that throughway 36 may place second recess 22 in fluid communication with any surface of substrate chuck 14. Furthermore, what is desired is that throughway 34 facilitates placing first 20 and third 24 recesses and throughway 36 facilitates placing second recesses 22 in fluid communication with a pressure control system, such as a pump system 38.

Pump system 38 may include one or more pumps to control the pressure proximate to first 20, second 22, and third 24 recesses. To that end, when substrate 12 is coupled to substrate chuck 14, substrate 12 rests against first 26, second 28, third 30, and fourth 32 support regions, covering first 20, second 22, and third 24 recesses. First recess 20 and a portion 40a of substrate 12 in superimposition therewith define a first chamber 42. Second recess 22 and a portion 40b of substrate 12 in superimposition therewith define a second chamber 44. Third recesses 24 and a portion 40c of substrate 12 in superimposition therewith define a third chamber 46. Pump system 38 operates to control a pressure in first 42, second 44, and third 46 chambers.

Figure 5:
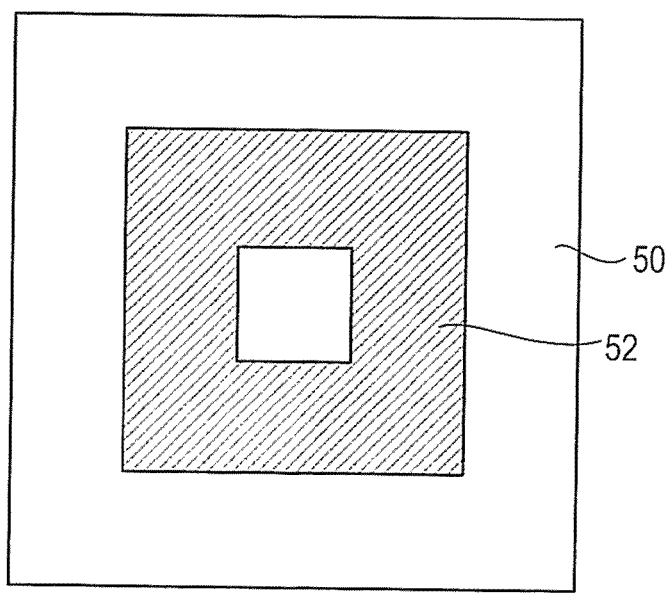
FIG. 5 is a top down view of the template shown in FIG. 1, having a mold coupled thereto.

Referring to FIGS. 1 and 5, spaced-apart from substrate 12 is a patterning device 48. Patterning device 48 comprises a template 50 having a mesa 52 extending therefrom towards substrate 12 with a patterning surface 54 thereon. Further, mesa 52 may be referred to as a mold 52. In a further embodiment, template 50 may be substantially absent of mold 52. Template 50 and/or mold 52 may be formed from such materials including but not limited to, fused-silica, quartz, silicon, organic polymers, siloxane polymers, borosilicate glass, fluorocarbon polymers, metal, and hardened sapphire. As shown, patterning surface 54 comprises features defined by a plurality of spaced-apart recesses 56 and protrusions 58. However, in a further embodiment, patterning surface 54 may be substantially smooth and/or planar. Patterning surface 54 may define an original pattern that forms the basis of a pattern to be formed on substrate 12.

Figure 6:
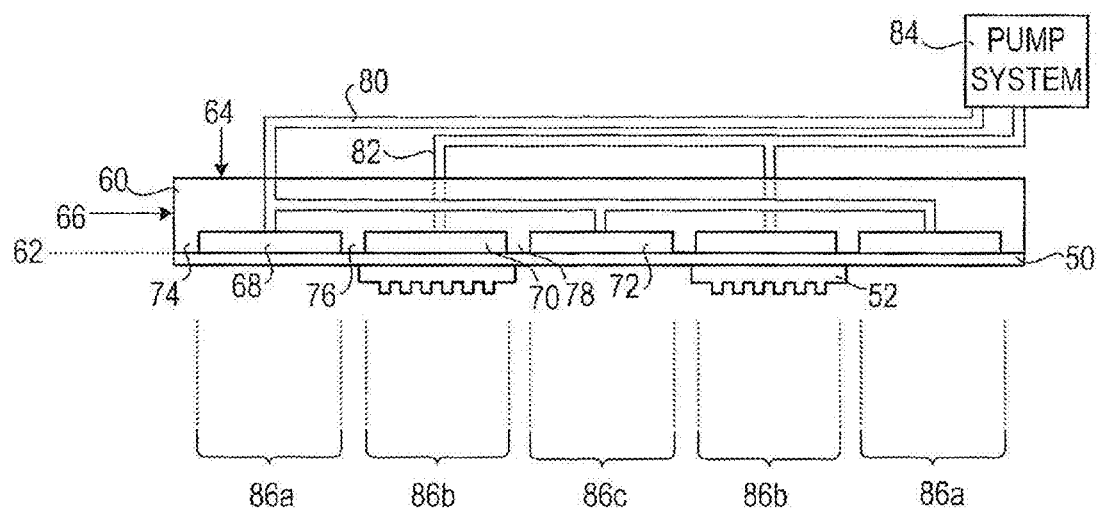
FIG. 6 is a side view of the template shown in FIG. 1 coupled to a template chuck.
Figure 7:
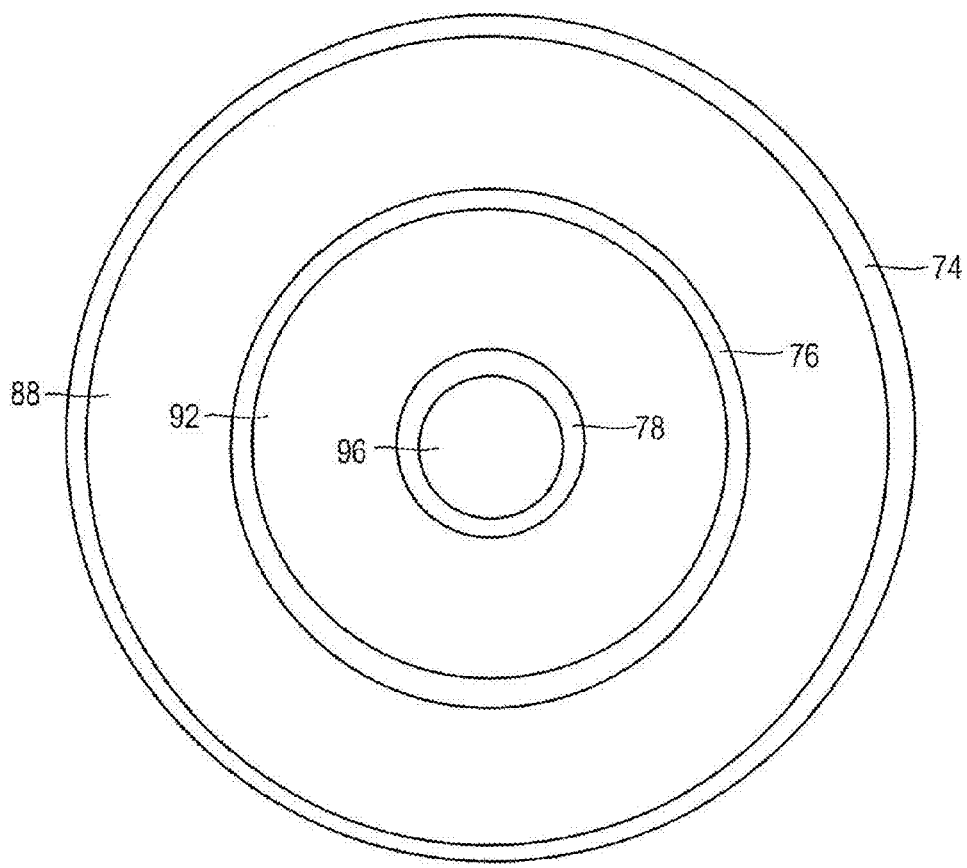
FIG. 7 is a bottom-up plan view of the template chuck shown in FIG. 6.

Referring to FIGS. 1, 6, and 7, template 50 may be coupled to a template chuck 60, template chuck 60 being any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes". Template chuck 60 includes first 62 and second 64 opposed sides. A side, or edge, surface 66 extends between first side 62 and second side 64. First side 62 includes a first recess 68, a second recess 70, and a third recess 72, defining first 74, second 76, and third 78 spaced-apart support regions. First support region 74 cinctures second 70 and third 72 support regions and first 68, second 70, and third 72 recesses. Second support region 76 cinctures third support region 78 and second 70 and third 72 recesses. Third support region 78 cinctures third recess 72. In a further embodiment, first 74, second 76, and third 78 support regions may be formed from a compliant material. First 74, second 76, and third 78 support regions may have a circular shape; however, in a further embodiment, first 74, second 76, and third 78 support regions may have any geometric shape desired.

Formed in template chuck 60 are throughways 80 and 82, however, template chuck 60 may comprise any number of throughways. Throughway 80 places first and third recesses 68 and 72 in fluid communication with second side 64, however, in a further embodiment, it should be understood that throughway 80 may place first and third recesses 68 and 72 in fluid communication with any surface of template chuck 60. Throughway 82 places second recess 70 in fluid communication with second side 64, however, in a further embodiment, it should be understood that throughway 80 may place second recess 70 in fluid communication with any surface of template chuck 60. Furthermore, what is desired is that throughway 80 facilitates placing first 68 and third 72 recesses and throughway 82 facilitates placing second recesses 70 in fluid communication with a pressure control system, such as a pump system 84.

Pump system 84 may include one or more pumps to control the pressure proximate to first 68, second 70, and third 72 recesses. To that end, when template 50 is coupled to template chuck 60, template 50 rests against first 74, second 76, and third 78 support regions, covering first 68, second 70, and third 72 recesses. First recess 68 and a portion 86a of template 50 in superimposition therewith define a first chamber 88. Second recess 70 and a portion 86b of template 50 in superimposition therewith define a second chamber 92. Third recess 72 and a portion 86c of substrate 12 in superimposition therewith define a third chamber 96. Pump system 84 operates to control a pressure in first 88, second 92, and third 96 chambers. Further, template chuck 60 may be coupled to an imprint head 97 to facilitate movement of patterning device 48.

Figure 8:
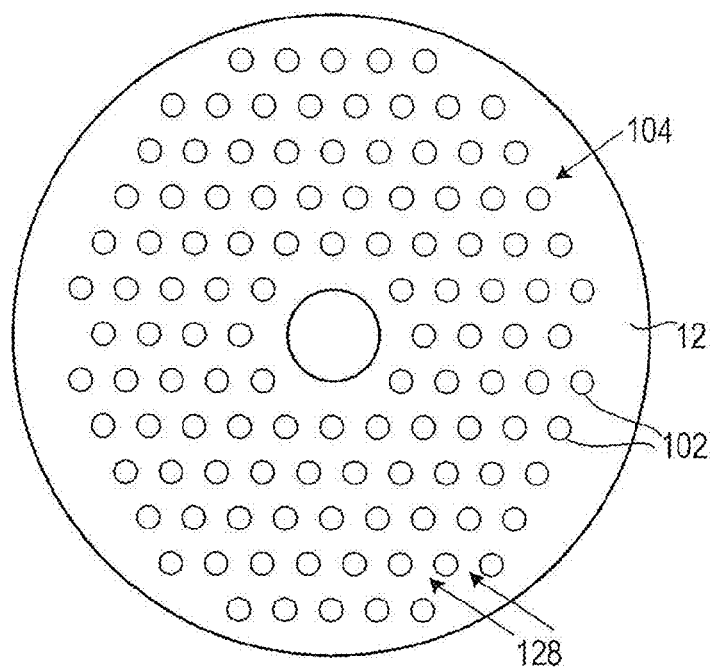
FIG. 8 is a top down view showing an array of droplets of imprinting material positioned upon a region of the substrate shown in FIG. 1.

Referring to FIG. 1, system 10 further comprises a fluid dispense system 98. Fluid dispense system 98 may be in fluid communication with substrate 12 so as to deposit polymerizable material 100 thereon. Fluid dispense system 98 may comprise a plurality of dispensing units therein. It should be understood that polymerizable material 100 may be deposited using any known technique, e.g., drop dispense, spin-coating, dip coating, chemical vapor deposition (CVD), physical vapor deposition (PVD), thin film deposition, thick film deposition, and the like. Typically, polymerizable material 100 may be disposed upon substrate 12 before the desired volume is defined between mold 52 and substrate 12. However, polymerizable material 100 may fill the volume after the desired volume has been obtained. As shown in FIG. 8, polymerizable material 100 may be deposited upon substrate 12 as a plurality of spaced-apart droplets 102, defining a matrix array 104. In an example, each droplet of droplets 102 may have a unit volume of approximately 1-10 pico-liters. Droplets 102 may be arranged in any two-dimensional arrangement on substrate 12.

Figure 9:
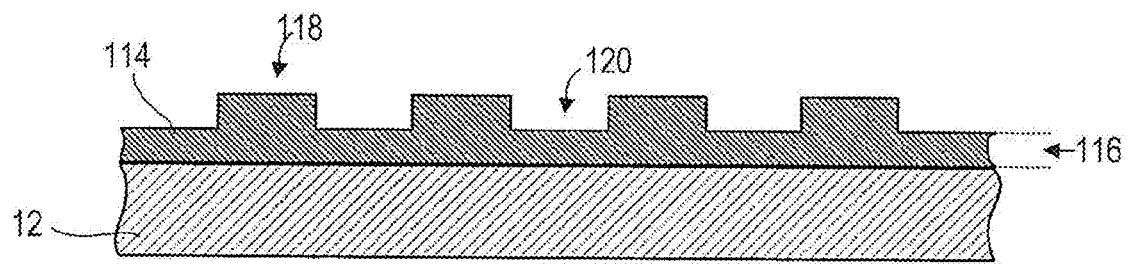
FIG. 9 is a simplified side view of the substrate shown in FIG. 1, having a patterned layer positioned thereon.

Referring to FIGS. 1 and 9, system 10 further comprises a source 106 of energy 108 coupled to direct energy 108 along a path 110. Imprint head 97 and stage 16 are configured to arrange mold 52 and substrate 12, respectively, to be in superimposition and disposed in path 110. Either imprint head 97, stage 16, or both vary a distance between mold 52 and substrate 12 to define a desired volume therebetween that is filled by polymerizable material 100. After the desired volume is filled with polymerizable material 100, source 106 produces energy 108, e.g., broadband ultraviolet radiation that causes polymerizable material 100 to solidify and/or cross-link conforming to the shape of a surface 112 of substrate 12 and patterning surface 54, defining a patterned layer 114 on substrate 12. Patterned layer 114 may comprise a residual layer 116 and a plurality of features shown as protrusions 118 and recessions 120. Control of this process is regulated by a processor 122 that is in data communication with stage 16, pump systems 38 and 84, imprint head 97, fluid dispense system 98, and source 106, operating on a computer readable program stored in a memory 124.

Referring to FIG. 1, system 10 further includes a pin 126 coupled to stage 16. Pin 126 may translate about a third axis orthogonal to the first and second axis, i.e., along the z axis. As a result, pin 126 may contact mold 52 to alter a shape thereof, described further below. Pin 126 may be any force or displacement actuator known in the art including, inter alia, pneumatic, piezoelectric, magnetostrictive, linear, and voice coils. In a further embodiment, pin 126 may be a high resolution pressure regulator and clean series air piston, with a center pin thereof comprising a vacuum source that may evacuate an atmosphere between an interface of patterning device 48 and substrate 12.

Referring to FIGS. 1, 8, and 9, as mentioned above, a distance between mold 52 and substrate 12 is varied such that a desired volume is defined therebetween that is filled by polymerizable material 100. Furthermore, after solidification, polymerizable material 100 conforms to the shape of surface 112 of substrate 12 and patterning surface 54, defining patterned layer 114 on substrate 12. To that end, in a volume 128 defined between droplets 102 of matrix array 104, there are gases present, and droplets 102 in matrix array 104 are spread over substrate 12 so as to avoid, if not prevent, trapping of gases and/or gas pockets between substrate 12 and mold 52 and within patterned layer 114. The gases and/or gas pockets may be such gases including, but not limited to air, nitrogen, carbon dioxide, and helium. Gas and/or gas pockets between substrate 12 and mold 52 and within patterned layer 114 may result in, inter alia, pattern distortion of features formed in patterned layer 114, low fidelity of features formed in patterned layer 114, and a non-uniform thickness of residual layer 116 across patterned layer 114, all of which are undesirable. To that end, a method and a system of minimizing, if not preventing, trapping of gas and/or gas pockets between substrate 12 and mold 52 and within patterned layer 114 are described below.

Figure 10:
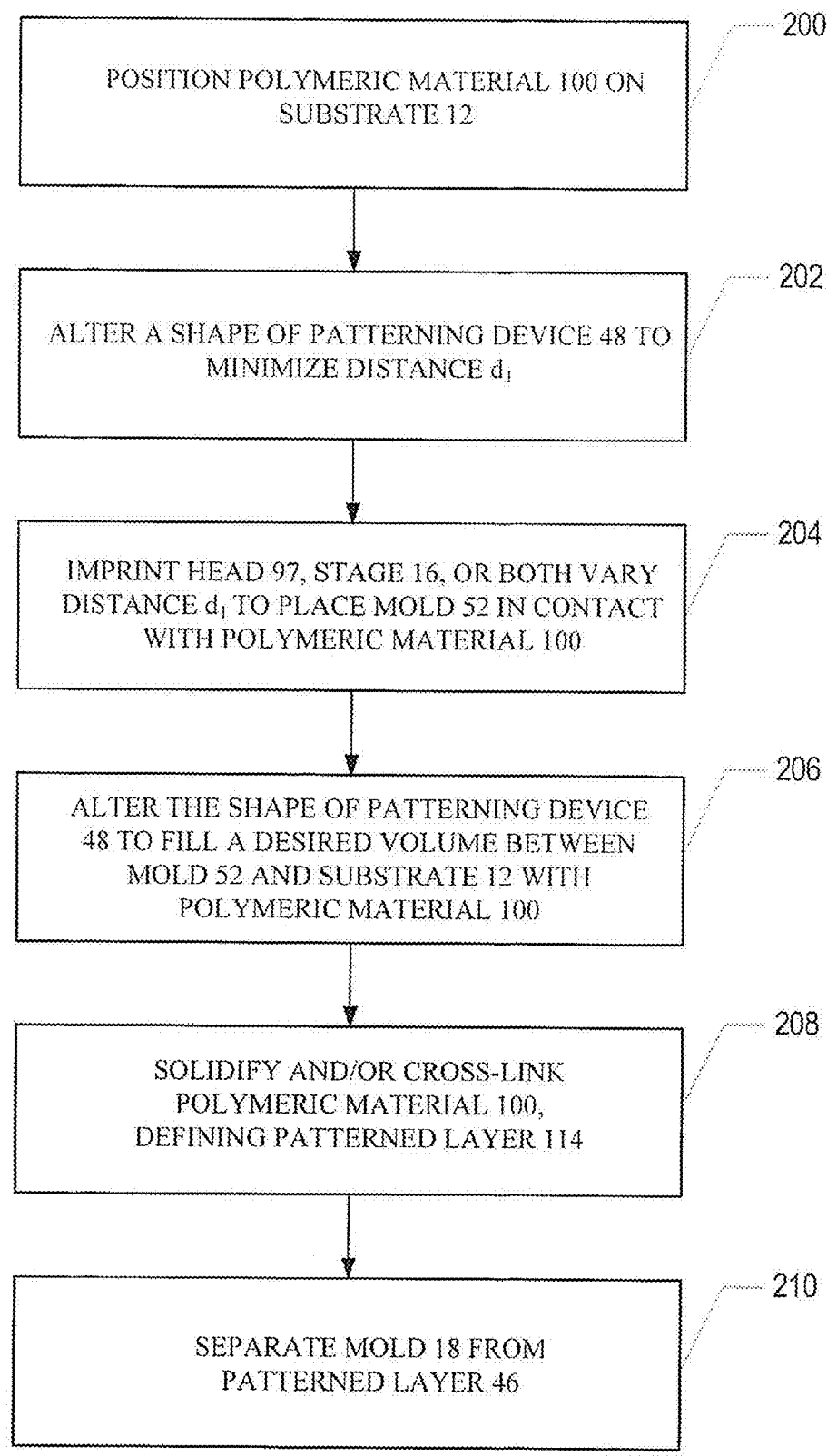
FIG. 10 is a flow diagram showing a method of patterning the substrate shown in FIG. 1, in a first embodiment.

Referring to FIGS. 1 and 10, in a first embodiment, a method of expelling gas between substrate 12 and mold 52 is shown. More specifically, at step 200, as mentioned above, polymerizable material 100 may be positioned on substrate 12 by drop dispense, spin-coating, dip coating, chemical vapor deposition (CVD), physical vapor deposition (PVD), thin film deposition, thick film deposition, and the like. In a further embodiment, polymerizable material 100 may be positioned on mold 52.

Referring to FIGS. 6, 7, 10, and 11, at step 202, a shape of patterning device 48 may be altered. More specifically, a shape of patterning device 48 may be altered such that a distance d1 defined between mold 52 and substrate 12 at middle radius r3 of substrate 12, shown in FIG. 2, is less than a distance defined between mold 52 and substrate 12 at remaining portions of mold 52. In an example, distance d1 is less than a distance d2, distance d2 being defined at an edge of mold 52. In a further embodiment, the distance d1 may be defined at any desired location of mold 52. The shape of patterning device 48 may be altered by controlling a pressure within first and third chambers 68 and 72. More specifically, as mentioned above, pump system 84 operates to control the pressure in first and third chambers 68 and 72. To that end, pump system 84 may create a vacuum within first and third chambers 68 and 72 via throughway 80 such that portions 86a and 86c of template 50 may bow away from substrate 12 and bow towards template chuck 60. As a result of bowing portions 86a and 86c of template 50 away from substrate 12, portion 86b of template 50 bows toward substrate 12 and away from template chuck 60.

Figure 11:
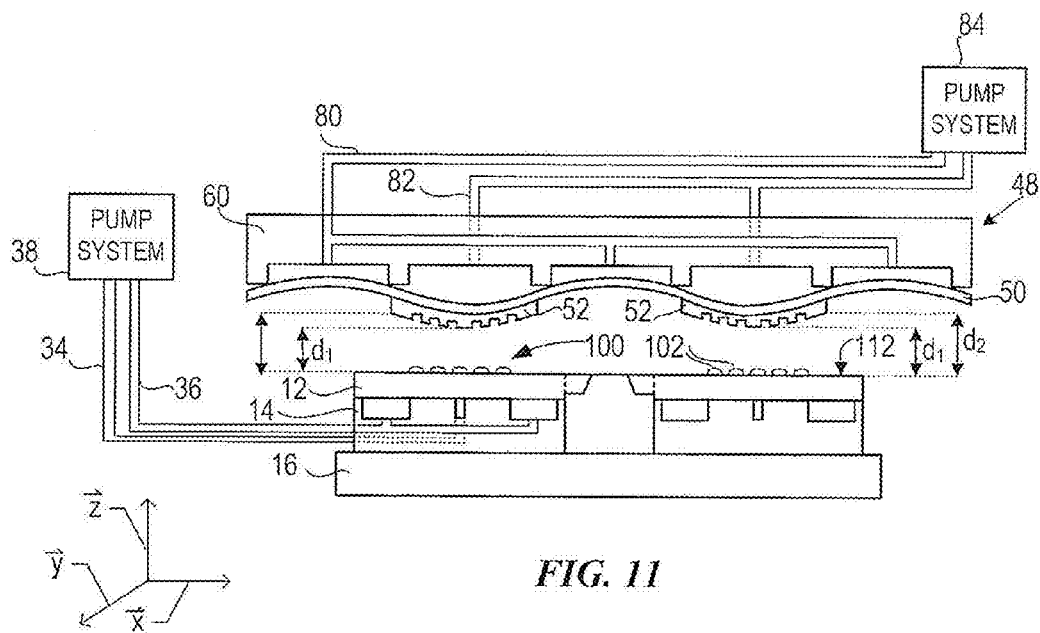
FIG. 11 is a side view of the patterning device shown in FIG. 1 having an altered shape.
Figure 12:
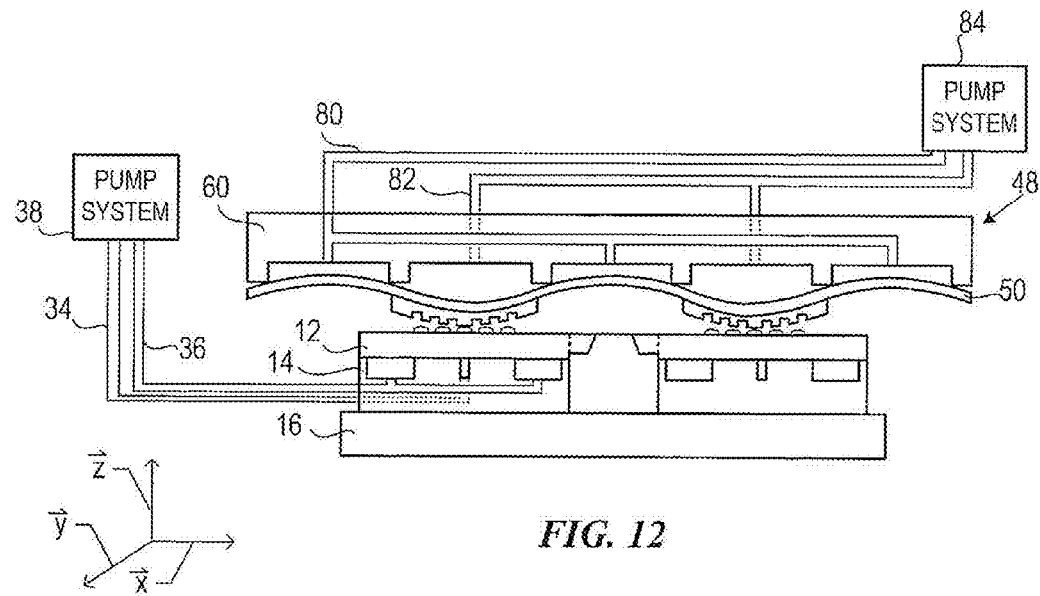
FIG. 12 is a side view of the patterning device shown in FIG. 11, in contact with a portion of the droplets of imprinting material shown in FIG. 8.
Figure 13:
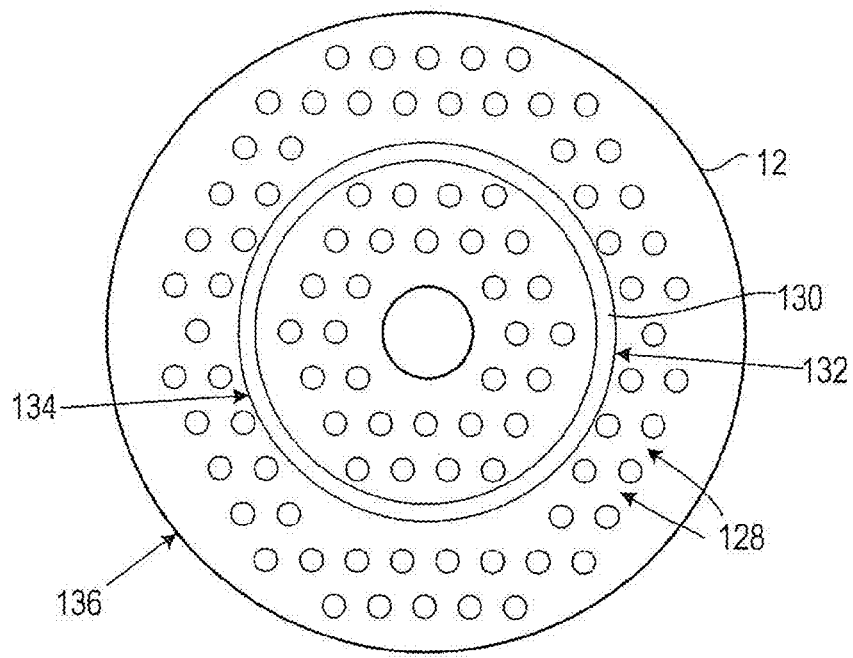
FIGS. 13-15 are top down views showing the compression of the droplets shown in FIG. 8, employing the altered shape of the template shown in FIG. 12.

Referring to FIGS. 10, 12, and 13, at step 204, as described above with respect to FIG. 1, either imprint head 97, shown in FIG. 1, stage 16, or both, may vary distance d1, shown in FIG. 11, such that a portion of mold 52 contacts a sub-portion of droplets 102. As shown, a portion of mold 52 in superimposition with middle radius r3 of substrate 12, shown in FIG. 2, contacts a sub-portion of droplets 102 prior to the remaining portions of mold 52 contacting the remaining droplets of droplets 102. However, in a further embodiment, any portion of mold 52 may contact droplets 102 prior to remaining portions of mold 52. To that end, as shown, mold 52 contacts all of droplets 102 in superimposition with middle radius r3 of substrate 12, shown in FIG. 2, substantially concurrently. This causes droplets 102 to spread and to produce a contiguous liquid sheet 130 of polymerizable material 100. Edge 132 of liquid sheet 130 defines a liquid-gas interface 134 that functions to push gases in volume 128 toward edge 136 of substrate 12. Volume 128 between droplets 102 define gas passages through which gas may be pushed to edge 136. As a result, liquid-gas interface 134 in conjunction with the gas passages reduces, if not prevents, trapping of gases in liquid sheet 130.

Figure 14:
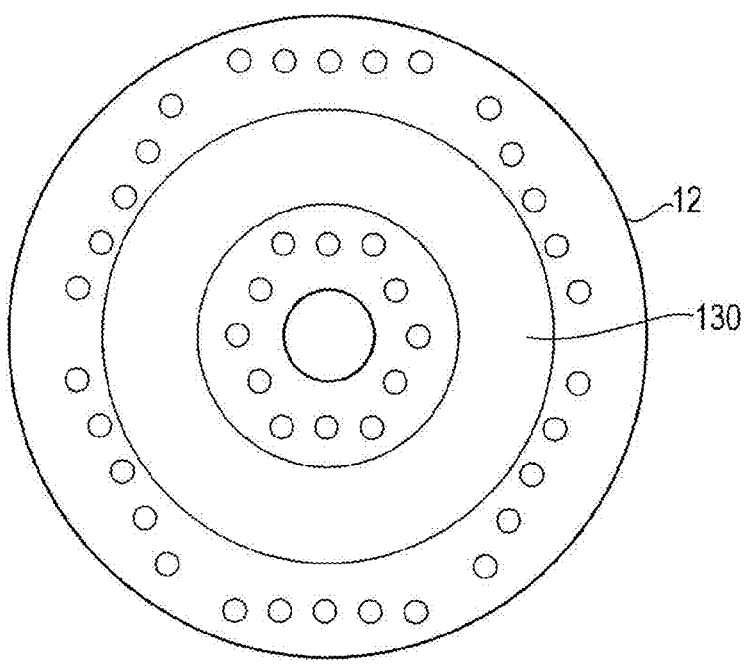
Figure 15:
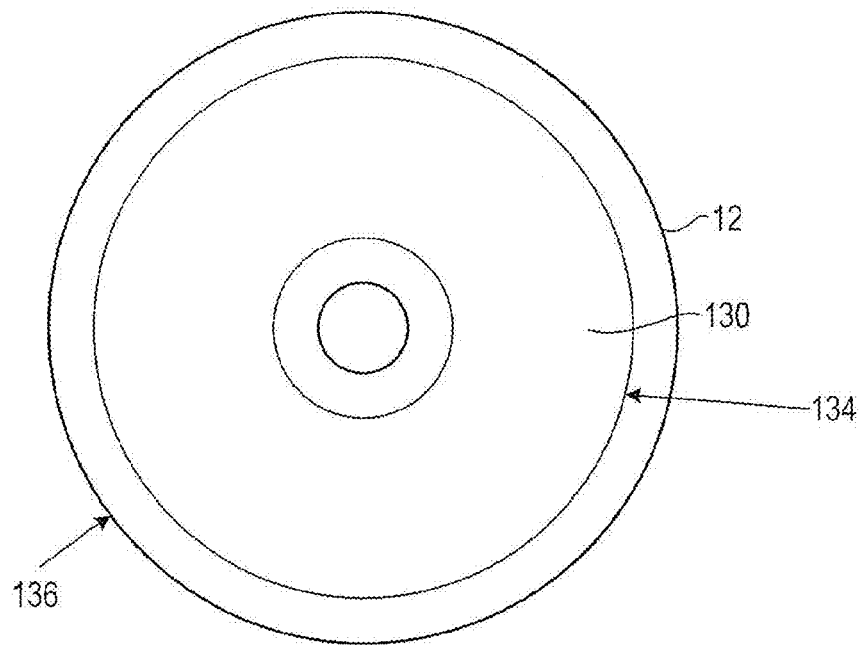

Referring to FIGS. 7, 10, and 14, at step 206, the shape of patterning device 48 may be altered such that the desired volume defined between mold 52 and substrate 12 may be filled by polymerizable material 100, as described above with respect to FIG. 1. More specifically, the shape of patterning device 48 may be altered by the combination of controlling the pressure within first and third chambers 88 and 96 and a force exerted by imprint head 97, shown in FIG. 1, and/or stage 16 upon patterning device 48 as a result of contact been polymerizable material 100 and mold 52. More specifically, as mentioned above, pump system 84 operates to control the pressure in first and third chambers 88 and 96. To that end, pump system 84 decreases a magnitude of the vacuum created within first and third chambers 88 and 96 via throughway 80 such that polymerizable material 100 associated with subsequent subsets of droplets 100 surrounding middle radius r3 of substrate 12 shown in FIG. 2, spread to become included in contiguous fluid sheet 130, as shown in FIG. 14. The shape of patterning device 48 continues to be altered such that mold 52 subsequently comes into contact with the remaining droplets 102 so that polymerizable material 100 associated therewith spreads to become included in contiguous sheet 130, as shown in FIG. 15. As can be seen, interface 134 has moved towards edge 136 so that there is an unimpeded path for the gases in the remaining volume 128, shown in FIG. 8, to travel thereto. This allows gases in volume 128, shown in FIG. 8, to egress from between mold 52 and substrate 12 vis-à-vis edge 136. In this manner, the trapping of gas and/or gas pockets between substrate 12 and mold 52 and within patterned layer 114, shown in FIG. 9, is minimized, if not prevented. In a further embodiment, the shape of patterning device 48 may be altered concurrently with decreasing the distance d1, as mentioned above with respect to FIG. 11. Referring to FIGS. 7 and 12, in still a further embodiment, to facilitate altering a shape of patterning device 48, a pressure within second chamber 92 may be controlled. More specifically, as mentioned above, pump system 84 operates to control the pressure in second chamber 92. To that end, pump system 84 may create a pressure within second chamber 92 via throughway 82 such that portion 86c of template 50 may bow towards substrate 12 and bow away from template chuck 60. Further, a pressure may be created within second chamber 92 concurrently with creating a vacuum in first and third chamber 88 and 96, as mentioned above.

Referring to FIGS. 1 and 10, at step 208, as mentioned above with respect to FIG. 1, polymerizable material 100 may be then be solidified and/or cross-linked, defining patterned layer 114, shown in FIG. 9. Subsequently, at step 210, mold 52 may be separated from patterned layer 114, shown in FIG. 9.

Figure 16:
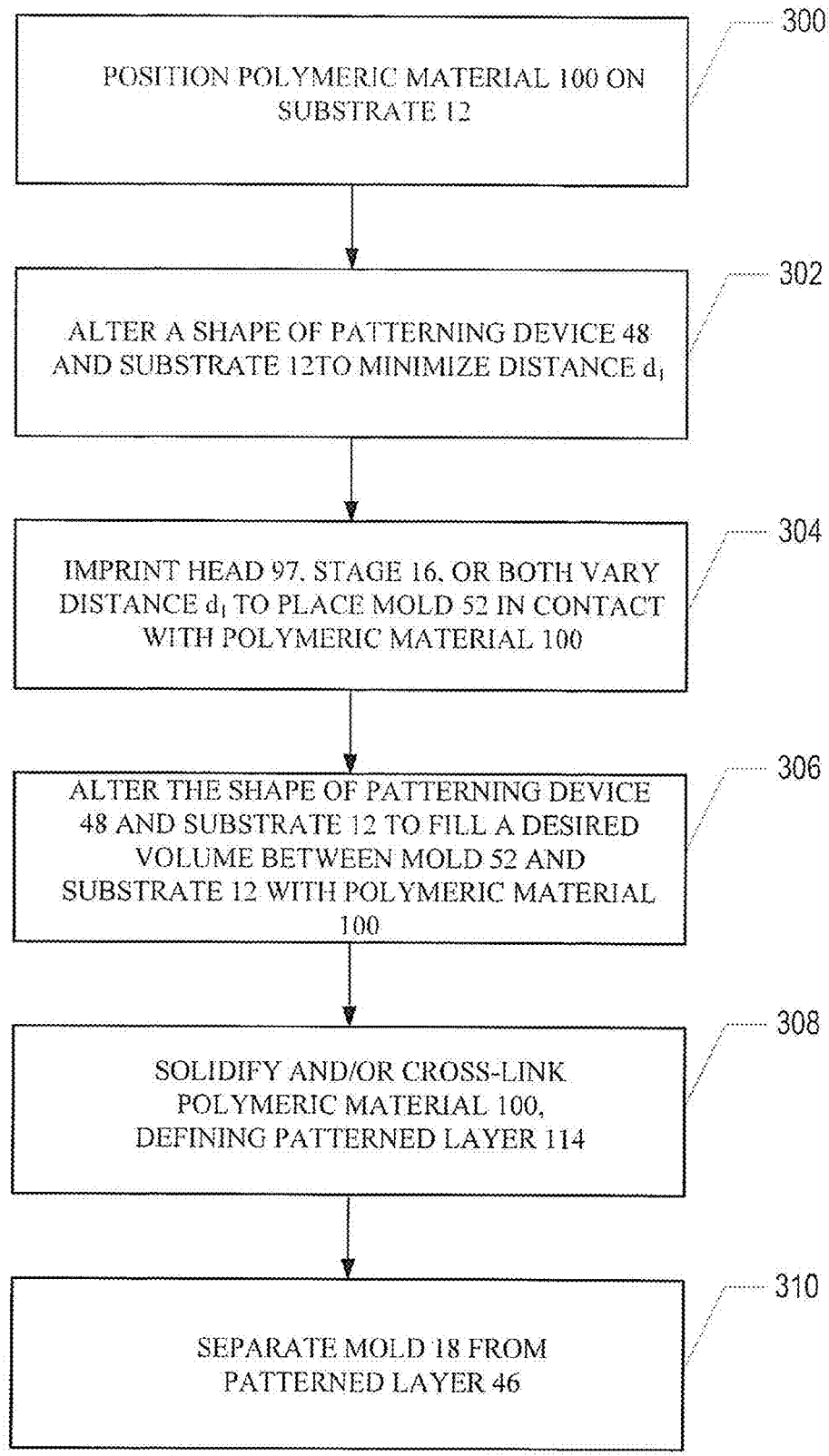
FIG. 16 is a flow diagram showing a method of patterning a region of the substrate shown in FIG. 1, in a second embodiment.

Referring to FIGS. 1 and 16, a further embodiment of the present invention is shown. More specifically, at step 300, analogous to that mentioned above with respect to step 200, shown in FIG. 10, polymerizable material 100 may be positioned on substrate 12 or mold 52.

Figure 17:
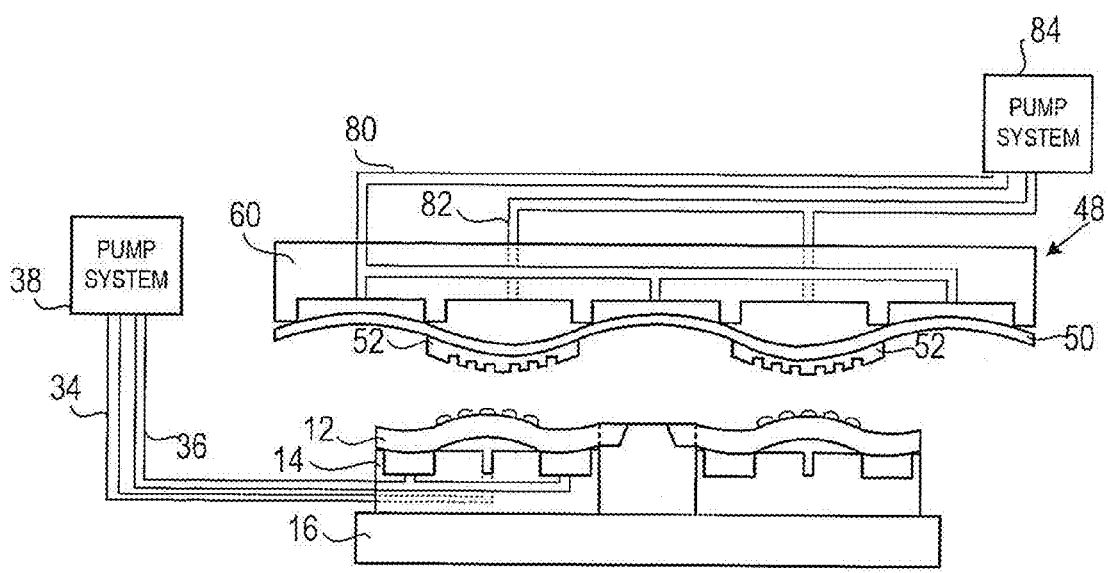
FIG. 17 is a side view of the substrate shown in FIG. 1 having an altered shape.

Referring to FIGS. 3, 4, 16, and 17, at step 302, analogous to that mentioned above with respect to step 202, shown in FIG. 10, a shape of patterning device 48 may be altered. Furthermore, concurrently with altering a shape of patterning device 48, a shape of substrate 12 may be altered. More specifically, a shape of substrate 12 may be altered by controlling a pressure within first and third chambers 42 and 46. More specifically, as mentioned above, pump system 38 operates to control the pressure in first and third chambers 42 and 46. To that end, pump system 38 may create a vacuum within first and third chambers 42 and 46 via throughway 36 such that portions 40a and 40c of substrate 12 may bow away from substrate chuck 14 and bow towards mold 52, as shown in FIG. 17. As a result of bowing portions 40a and 40c of substrate 12 toward from substrate chuck 14, portion 40b of substrate 12 bows toward mold 52 and away from substrate chuck 14. Referring to FIGS. 11, 13, and 16, at step 304, analogous to that mentioned above with respect to step 204, shown in FIG. 10, imprint head 97, stage 16, or both, may vary distance d1, shown in FIG. 11, such that a portion of mold 52 contacts a sub-portion of droplets 102 in superimposition with middle radius r3 of substrate 12, shown in FIG. 2, substantially concurrently, producing contiguous liquid sheet 130 of polymerizable material 100.

Referring to FIGS. 4, 12, and 16, at step 306, analogous to that mentioned above with respect to step 206, shown in FIG. 10, the shape of patterning device 48 may be altered such that the desired volume defined between mold 52 and substrate 12 may be filled by polymerizable material 100. Furthermore, concurrently with altering the shape of patterning device 48, the shape of substrate 12 may be altered. More specifically, as mentioned above, pump system 38 operates to control the pressure in first and third chambers 42 and 46. To that end, pump system 38 decreases a magnitude of the vacuum created within first and third chambers 42 and 46 via throughway 36 concurrently with altering a shape of patterning device 48 as mentioned above in step 204, shown in FIG. 10, such that polymerizable material 100 associated with droplets 102 surrounding middle radius r3 of substrate 12, shown in FIG. 2, spread to become included in contiguous fluid sheet 130, as shown in FIG. 14. The shape of substrate 12 may be further altered concurrently with the shape of patterning device 48 being altered such that mold 52 subsequently comes into contact with the remaining droplets 102 so that polymerizable material 100 associated therewith spreads to become included in contiguous sheet 130, as shown in FIG. 15. The gases in volume 128, shown in FIG. 8 may egress from between mold 52 and substrate 12 vis-à-vis edge 136 in substantially the same method as mentioned above with respect to step 206, shown in FIG. 10.

Referring to FIGS. 3 and 4, to further facilitate altering a shape of substrate 12, a pressure within second chamber 44 may be controlled. More specifically, as mentioned above, pump system 38 operates to control the pressure in second chamber 44. To that end, pump system 38 may create a pressure within second chamber 44 via throughway 34 such that portion 40b of substrate 50 may bow towards mold 52 and bow away from substrate chuck 14. Further, a pressure may be created within second chamber 44 concurrently with creating a vacuum in first and third chamber 42 and 46, as mentioned above.

Referring to FIGS. 1 and 10, at step 308, as mentioned above with respect to FIG. 1, polymerizable material 100 may be then be solidified and/or cross-linked, defining patterned layer 114, shown in FIG. 9. Subsequently, at step 310, mold 52 may be separated from patterned layer 114, shown in FIG. 9.

Figure 18:
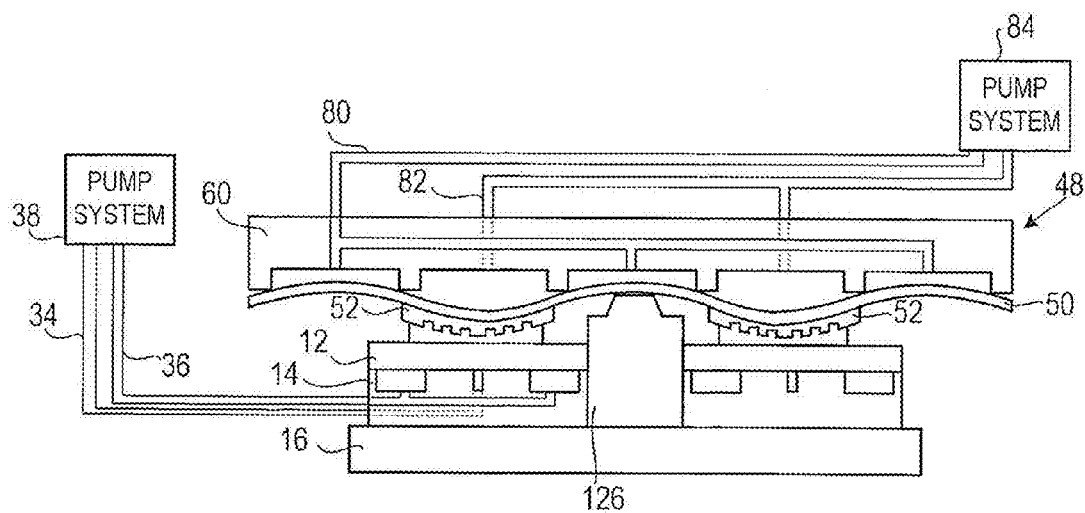
FIG. 18 is a side view of a pin exerting a force on the patterning device shown in FIG. 1, to alter a shape thereof.

Referring to FIGS. 6 and 18, in a further embodiment, to facilitate altering a shape of patterning device 48, pin 126 may be employed. More specifically, pin 126 may exert a force upon patterning device 48, and in the present example, upon third portion 86c of template 50. As a result, patterning device 48 may comprise the aforementioned desired altered shape and may be employed in any of the methods mentioned above. Pin 126 may be also employed to facilitate separation of mold 52 and substrate 12, as mentioned above with respect to steps 208 and 308, shown in FIGS. 10 and 16, respectively. Furthermore, after formation of patterned layer 114, shown in FIG. 9, pin 126 may translate away from patterned device 48 such that patterning device 48 may be substantially flat. Pin 126 may be in communication with processor 122 such that pin 126 may employ force feedback to determine a magnitude of the force.

Figure 19:
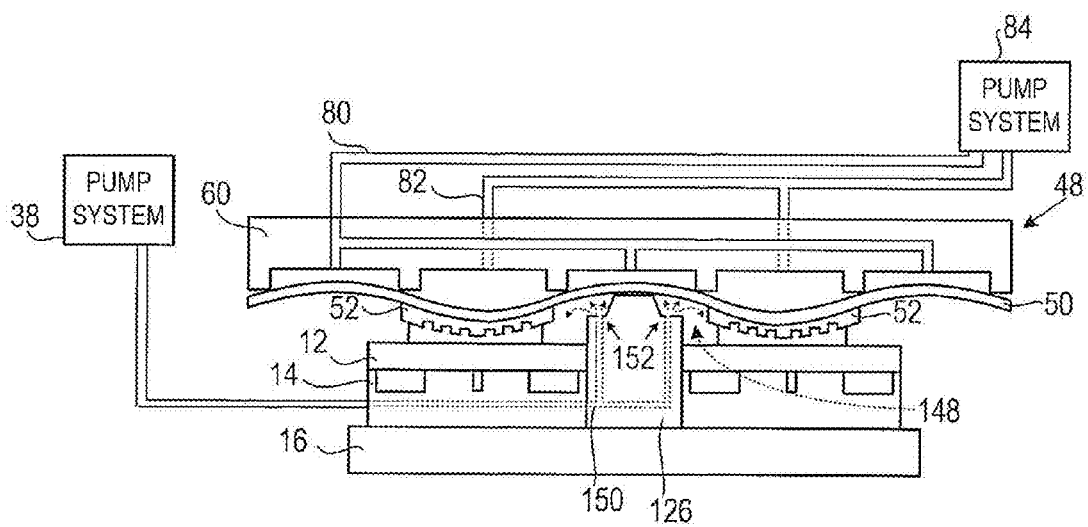
FIG. 19 is a side view of the system shown in FIG. 1, with a gas being introduced between the patterning device and the mold.

Referring to FIG. 19, to further facilitate separation of mold 52 and substrate 12, a gas 148 may be introduced between substrate 12 and mold 52 via pin 126. More specifically, pin 126 may comprise a throughway 150 having apertures 152 in fluid communication with a pressure control system, such as a pump system 38. In a further embodiment, pin 126 may comprise any number of apertures. Apertures 152 may be positioned to introduce gas 148 between mold 52 and substrate 12. Gas 148 exerts a force upon mold 52 and substrate 12 to push mold 52 in a direction away from substrate 12 and to push substrate 12 in a direction away from mold 52. As shown, gas 148 may be introduced between mold 52 and substrate 12 when pin 126 is proximate to template 50; however, in a further embodiment, gas 148 may be introduced between mold 52 and substrate 12 when pin 126 is in any position.

Figure 20:
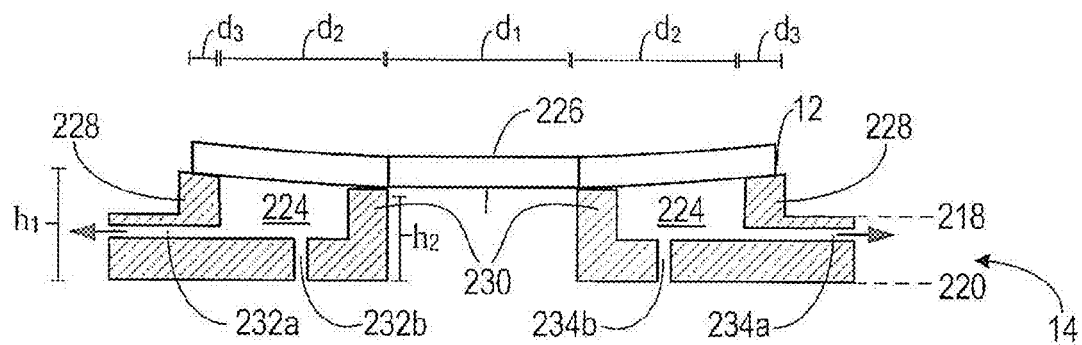
FIG. 20 is a simplified side view of an exemplary substrate chuck providing substrate in a single wave formation.

FIG. 20 illustrates another embodiment of substrate chuck 14a shown in FIG. 1 that may provide single wave bending of substrate 12. In a single wave imprint, inner diameter $d_1$ of substrate 12 may minimize sensitivity to non-uniformity of chuck 14 (e.g., planarity), tilt errors between template 18 and substrate 12, and/or axial errors between template 18 and substrate 12. As inner diameter $d_1$ of substrate 12 may be reserved as a non-imprinted zone, imprinting defects and/or separation defects may be minimized. Further, chuck 14a may minimize contact between outer diameter $d_3$ of substrate 12 and chuck 14a reducing defects.

Substrate chuck 14a may include first 218 and second 220 opposed sides. A side, or edge, surface 222 may extend between first 218 and second 220 opposed sides. First side 218 may include a first recess 224 and a second recess 226. First recess 224 and second recess 226 may define first support region 228 and second support region 230. First support region 228 may cincture second support region. Support regions 228 and 230 may have a circular shape, rectangular shape, square shape, and/or any fanciful shape based on design considerations.

As illustrated in FIG. 20, support region 228 may include a height $h_1$ greater than height $h_2$ of support region 230. Height $h_1$ of support region 228 may have a magnitude greater than height $h_2$ of support region 230 such that during imprinting substrate 12 obtains a single wave deformation. Single wave deformation may generally be described as a single wave shape wherein substrate 12 assumes a concave bend such that surface 229 of substrate 12 may be substantially tangential to support region 230 and/or support region 228. For example, height $h_1$ of support region 228 may have a magnitude approximately 80 microns greater than height $h_2$ of support region 230. Additionally, height $h_1$ of support region 228, height $h_2$ of support region 230, and/or magnitude difference between height $h_1$ of support region 228 and height $h_2$ of support region 230 may be based on thickness $t_1$ of substrate 12 and/or material of substrate 12. For example, magnitude difference between height $h_1$ of support region 228 and height $h_2$ of support region 230 may be approximately 100 microns for substrate 12 of fused silica having thickness $t_1$ of approximately 635 microns.

Referring to FIGS. 1, 2 and 20, outer diameter $d_3$ of substrate 12 may generally be the first point of separation and as such may require maximum retention capability during separation of template 18 and patterned layer 46 subsequent to imprinting as described in relation to FIGS. 1 and 2. By increasing height $h_1$ of support region 228, vacuum force provided by chuck 14a may be biased towards outer diameter $d_3$. Biasing of vacuum force may decrease retention force needed and/or decrease separation force needed during separation of template 18 and patterned layer 46.

Formed in substrate chuck 14a may be throughways 234 and 236. It should be noted substrate chuck 14a may include additional throughways depending on design considerations. Two throughways 234 and 236 are shown for simplicity. Throughways 234 and 236 may be in fluid communication with side surface 218 at recesses 224 and 226. Throughways 234 and 236 may facilitate positioning of recesses 224 and/or 226 in fluid communication with a pressure control system (e.g., pump system). For example, pump system may provide one or more pumps capable of controlling pressure proximate to recesses 224 and/or 226.

Figure 21A:
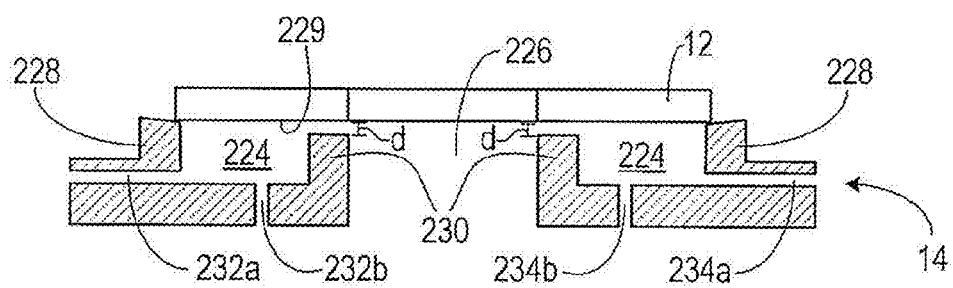
FIGS. 21A-21C are simplified side view of an exemplary substrate chuck providing substrate in multiple exemplary formations.
Figure 21B:
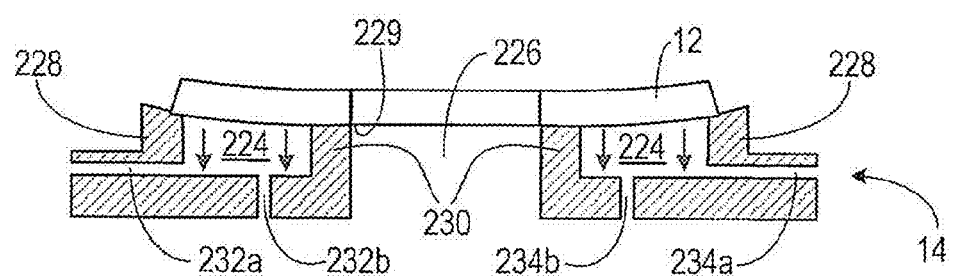
Figure 21C:
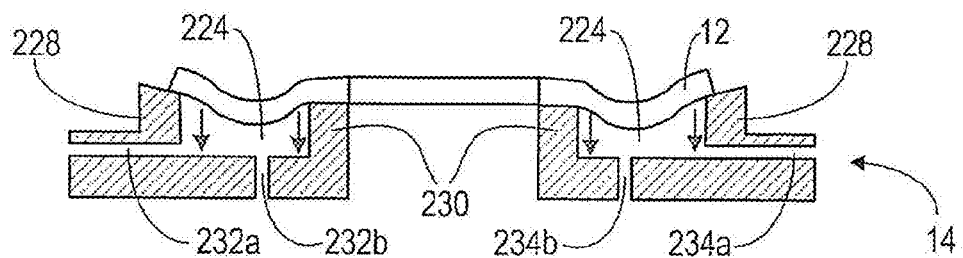

Referring to FIGS. 21A-21C, in one embodiment, height $h_1$ of support region 228 may be determined based on a pre-determined pressure level applied by pressure control system to recesses 224 and/or 226 in addition to or in lieu of determining characteristics described herein (e.g., thickness $t_1$, materiality of substrate 12, and/or the like). For example, height $h_1$ of support region 228 may be based on a standard pressure level that when applied provides substrate 12 in a single wave as illustrated in FIG. 20. With substrate 12 in a single wave during imprinting, as described herein, inner diameter $d_2$ of substrate 12 may assume a substantially concave shape.

Pressure level(s) may be adapted to provide single wave deformation of substrate 12 based on height $h_1$ of support region 228. For example, FIG. 21A illustrates substrate 12 subjected to about 0 kPa. Substrate 12 at about 0 kPa may exhibit substantial planarity. Additionally, substrate 12 and support region 230 may be separated by a distance d. For example, substrate 12 and support region 230 may be separated by approximately 100 microns. Referring to FIG. 21B, throughways 234 and 236 may provide recess 224 at approximately −5 kPa bending substrate 12 in a substantially single wave shape wherein substrate 12 assumes a concave bend such that surface 229 of substrate 12 may be substantially tangential to support region 230. At approximately −80 kPa, although portions of substrate 12 may still be substantially tangential to support region 230, substrate 12 assumes a double wave shape forming multiple concave bends in recess 224.

Figure 22A:
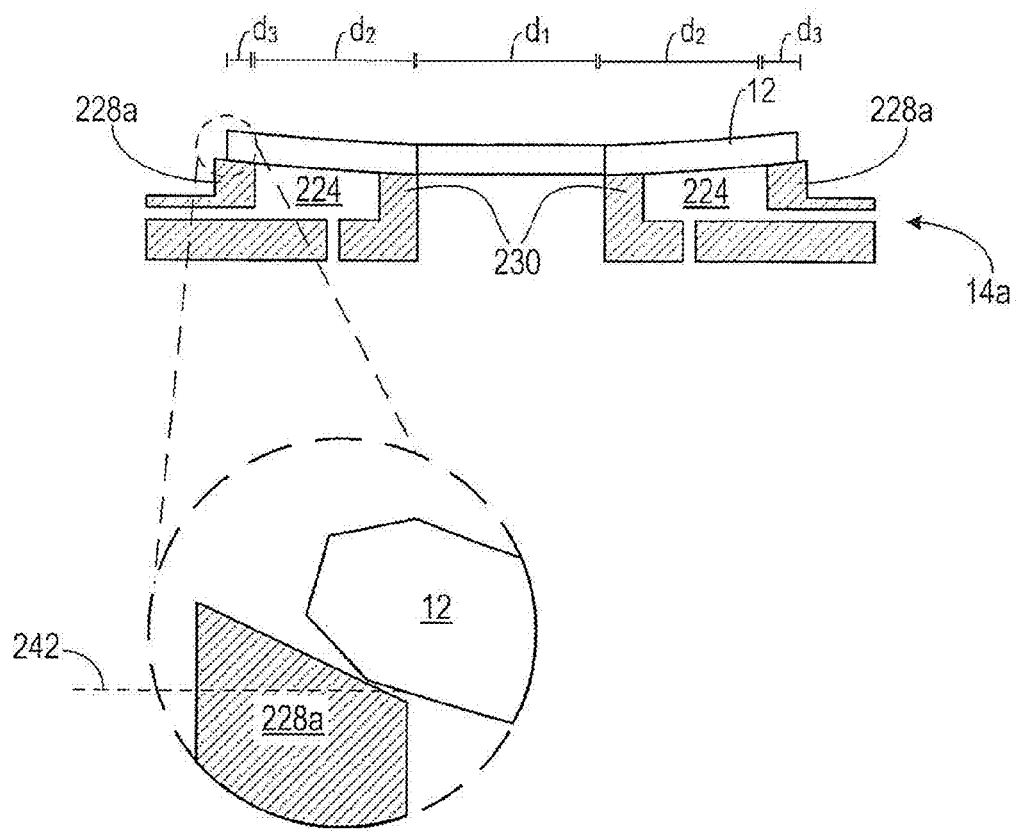
FIGS. 22A and 22B are simplified side views of an exemplary substrate chuck having exemplary outer lands.
Figure 22B:
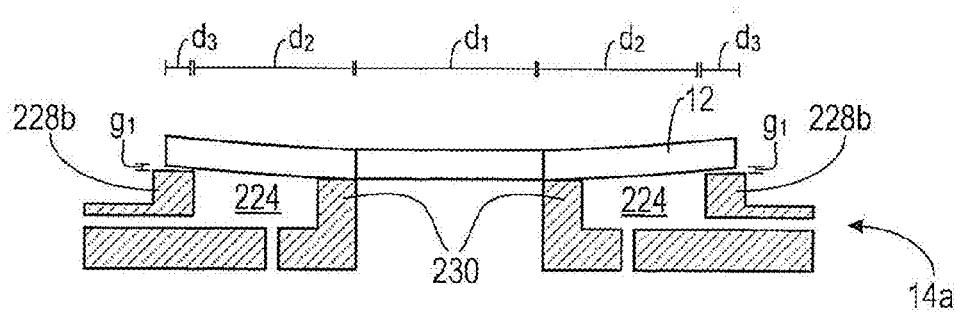

Referring to FIGS. 22A and 22B, in one embodiment, chuck 14a may provide substrate 12 in a single wave formation during imprinting while minimizing and/or eliminating defects at outer diameter $d_3$. For example, FIG. 22A illustrates an exemplary embodiment of chuck 14a wherein chuck 14a includes a tapered land 228a. Tapered land 228a may provide minimal contact between chuck 14a and substrate 12 at outer diameter $d_3$. Minimization of contact may further minimize defects at outer diameter $d_3$. Tapered land 228a may include height $h_1$ greater than height $h_2$ of support region 230. Further, tapered edge 240 of tapered land 228a may be set at an angle (e.g., approximately 2-5°) relative to an axis 242. Angle may be adapted such tapered land 228a has minimal contact or no contact with edge 244 (i.e., flat region) of substrate 12 as shown in FIG. 22A.

FIG. 22B illustrates another exemplary embodiment of chuck 14a wherein chuck 14a includes substantially planar land 228b. Positioning of substrate 12 in single wave shape may provide outer diameter $d_3$ of substrate 12 at a distance g, from substantially planar land 228b.

Figure 23:
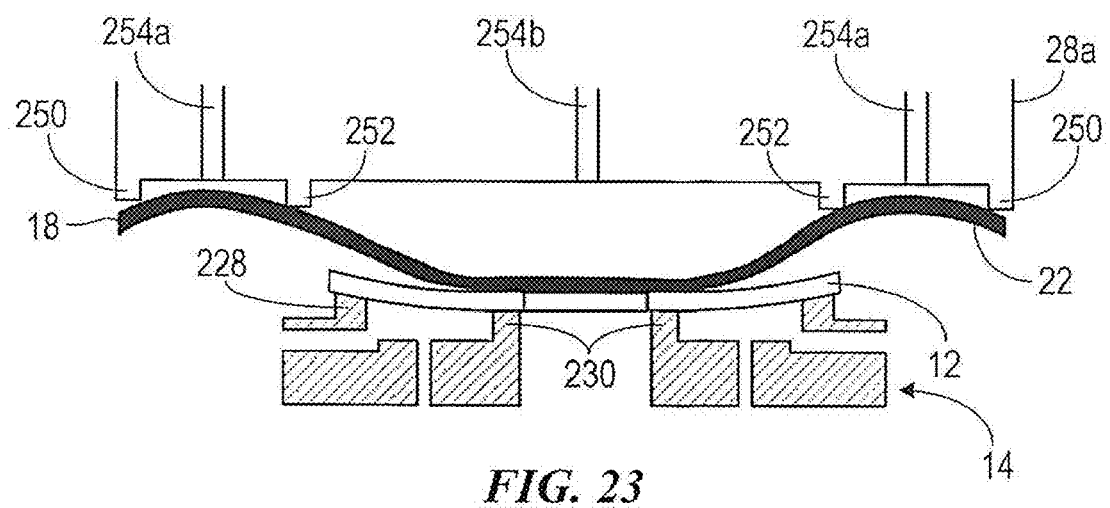
FIG. 23 is a simplified side view of an exemplary template chuck and an exemplary, substrate chuck providing an imprint lithography template and a substrate in single wave formations.

Referring to FIG. 23, in one embodiment, template chuck 28a may provide patterning surface 22 of template 18 to conform to single wave shape of substrate 12 during imprinting and/or separation. Template chuck 28a may include throughways 254 adapted to provide a vacuum and/or pressure affecting shaping of template 18. For example, throughway(s) 254a may provide a vacuum holding outer edge of template 18 such that outer edges of template 18 bow towards chuck 28. Throughway(s) 254b may provide vacuum and/or pressure such that center of template 18 bows towards substrate 12. Center of template 18 may contact substrate 12 conforming to single wave shape. For example, center of template 18 may contact inner diameter $d_1$ of substrate 12 with fluid motion of polymerizable material 34 flowing outward towards outer diameter $d_3$ of substrate 12. Additionally, during separation, final separation may occur at center of template 18 and inner diameter $d_1$ of substrate 12 with single wave shape of substrate 12 and conforming shape of template 18.

Referring to FIGS. 24A-D, in another embodiment, template chuck 28b may provide patterning surface 22 of template 18 in a double wave formation during imprinting and/or separation with substrate 12 having a single wave shape.

Figure 24A:
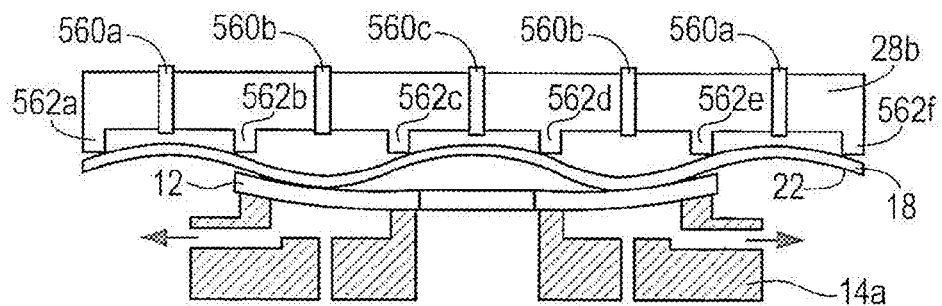
FIG. 24A-24D are simplified side view of another exemplary template chuck and an exemplary substrate chuck providing an imprint lithography template in a double wave formation and a substrate in a single wave formation.
Figure 24B:
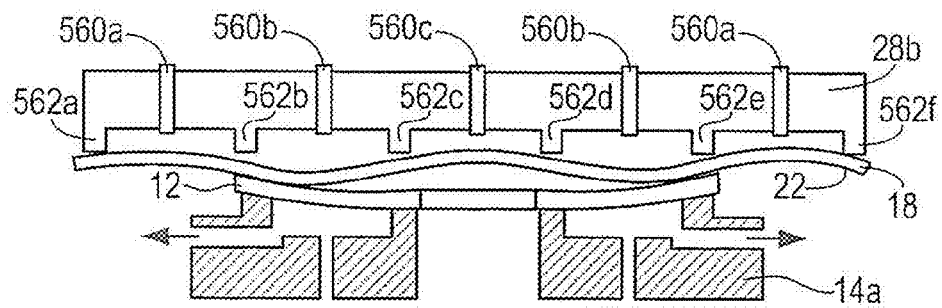
Figure 24C:
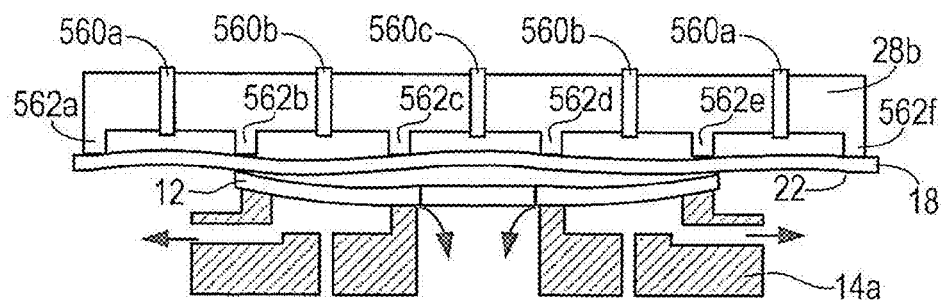
Figure 24D:
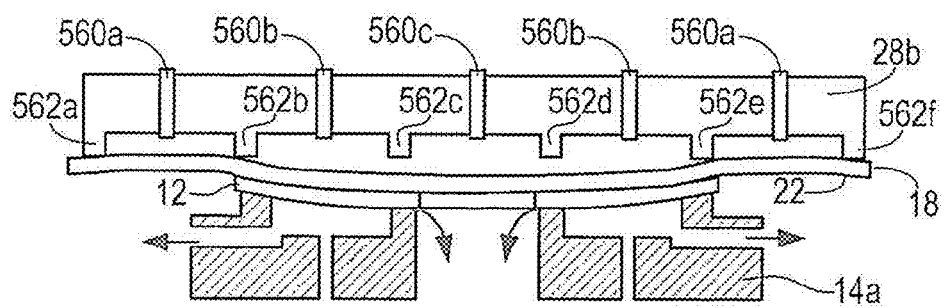

Referring to FIG. 24A, throughways 560a-560c of template chuck 28b may provide vacuum and/or pressure to provide template 18 in a double wave formation. For example, throughway 560b may provide pressure while throughways 560a and 560c may provide vacuum in chambers formed by lands 562a-562c (e.g., three or more chambers). Pressure and/or vacuum within chambers may provide template 18 in a double wave formation such that portions of template 18 in superimposition with throughway 560b bow towards substrate 12 and portions of template 18 in superimposition with throughways 560a and 560c may bow away from substrate 12. Portions of template 18 in superimposition with throughway 560b may contact substrate 12 first. It should be noted that additional throughways 560 and/or chambers may be used. As illustrated in FIG. 24b, vacuum may be reduced and/or pressure reduced such that template 18 contacts remaining portions of substrate 12. In particular, portion of template 18 in superimposition with throughway 560c (e.g., in superimposition with inner diameter of substrate 12), may contact substrate 12 last. As such, gas between template 18 and substrate 12 may be evacuated at inner diameter of substrate 12.

During the imprinting process, generally the surface of substrate 12 may be provided in a substantially well-controlled shape by substrate chuck 14 to avoid any localized fluid from spreading abnormally. Local surface adhesion between the mask 20 and the patterned surface 46 on the substrate 12, however, may exceed the holding effort from the substrate chuck 14. This may cause a localized bending of the substrate 12 at the boundary of the imprinted area. Such localized bending may cause a loss of vacuum holding pressure, and as such, separation may fail.

Figure 25:
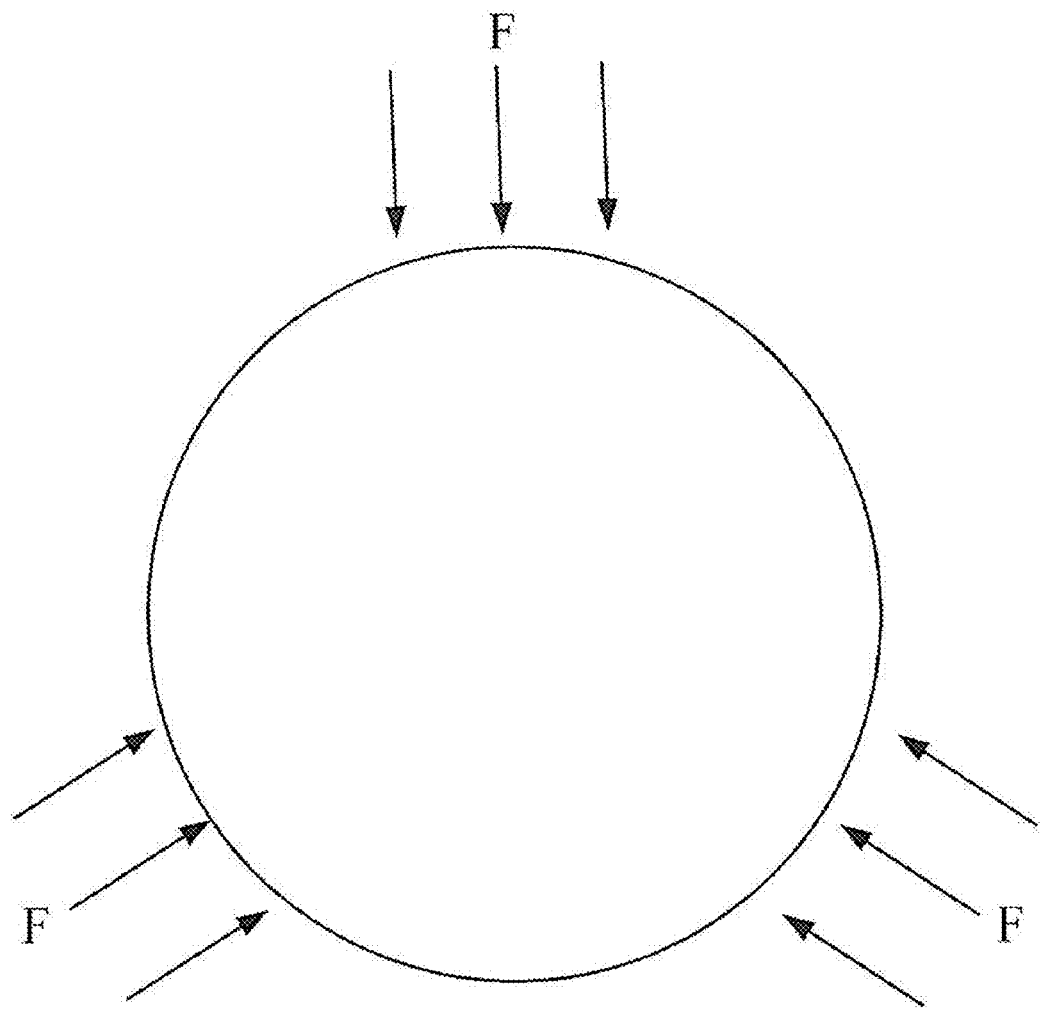
FIG. 25 is a top down view of a substrate subjected to forces.
Figure 26:
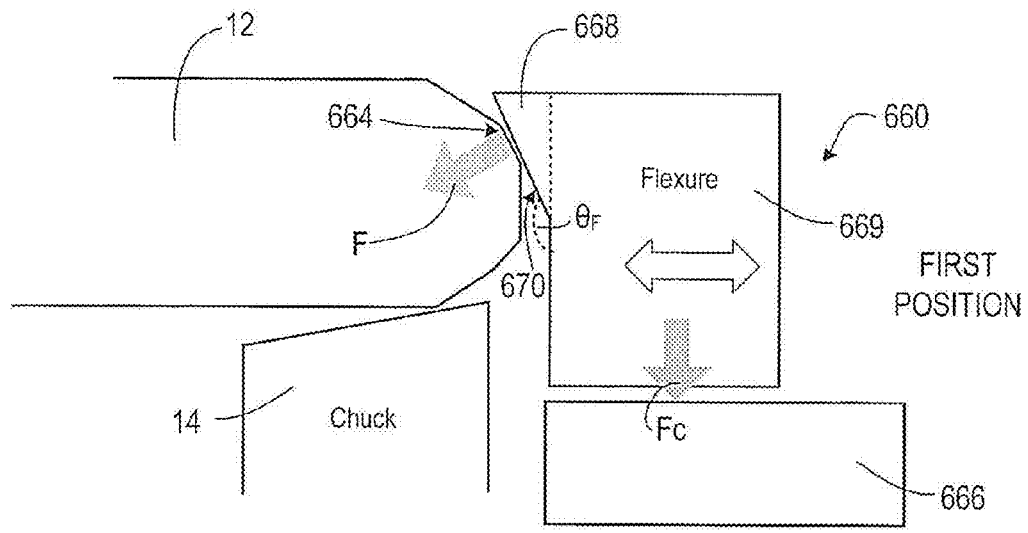
FIG. 26 is a simplified side view of an exemplary holding system in a first position, the first position constraining a substrate during separation of a template from the substrate.
Figure 27:
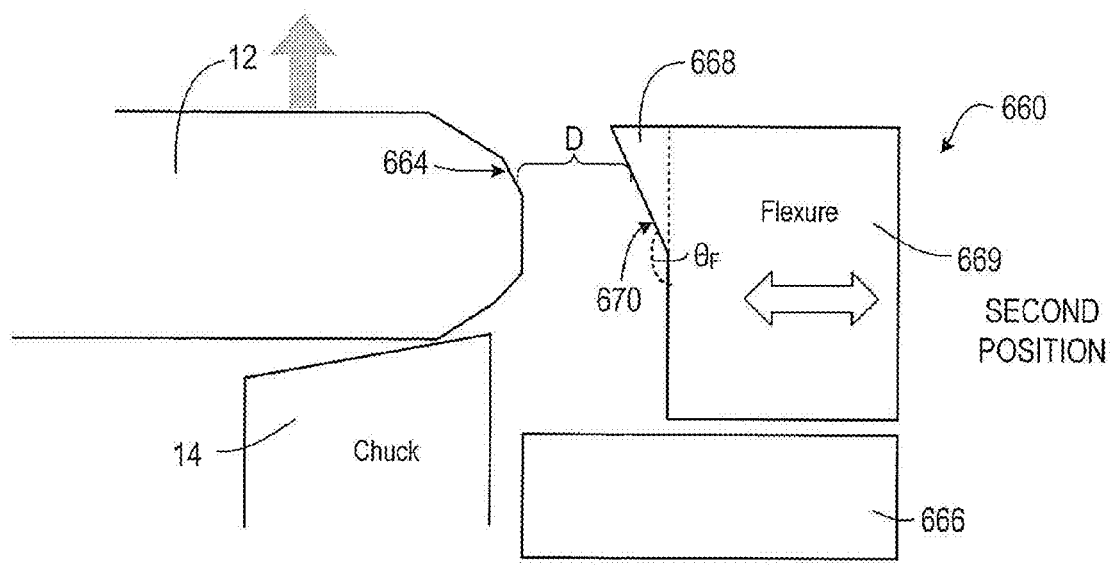
FIG. 27 is a simplified side view of the holding system illustrated in FIG. 26 in a second position, the second position distancing the holding system from the substrate.

Referring to FIGS. 25-27, constraint of substrate 12 may be provided by a holding system 660 in addition to, or in lieu of substrate chuck 14. Generally, holding system 660 may engage substrate 12, and by using a force F, may provide constraint of the substrate 12 during separation of patterned layer from template as described herein. In one embodiment, holding system 660 surrounds substrate 12. In another embodiment, multiple holding systems 660 may be strategically placed about substrate 12 to provide constraint of the substrate 12 during separation of template 18 from substrate 12.

Holding system 660 may include a contact head 668 and body 669. Contact head 668 may provide force F to constrain substrate 12. Contact head 668 may be stationary or adjustable depending on design considerations.

Contact head 668 may comprise a surface for contacting substrate 12. Contact head 668 have at least one surface 670 at an angle T relative to body 669 such that surface 670 aligns with a portion of substrate 12. For example, surface 670 at an angle T relative to body 669 such that surface 670 aligns with a chamfered edge 664 of substrate 12 as illustrated in FIG. 26. Having contact head 668 contact the chamfered edge 664 of substrate 12 may prevent interference of holding system 660 with patterned layer 46 (shown in FIG. 2) on substrate 12.

Upon contact with substrate 12, contact head 668 may provide force F to substrate 12 for constraining substrate 12 to substrate chuck 14. For example, contact head 668 may provide force F to chamfered edge 664 of substrate 12, as illustrated in FIG. 27, to substantially constrain substrate 12 to substrate chuck 14 during separation as described herein.

Holding system 660 may also comprise a base 666. Generally, body 669 may be adjustably attached to base 666 to provide radial motion of body 669 about the x- and y-axes. Radial motion of the body 669 about base 666 may provide distance between substrate 12 and contact head 668 for loading and unloading of substrate 12. For example, as illustrated in FIG. 26, in a first position body 669 may be positioned on base 666 such that contact head 668 may be in contact with substrate 12. As illustrated in FIG. 27, in a second position radial motion of body 669 about base 666 may provide contact head 668 to be located a set distance D away from substrate 12. In this position, substrate 12 may be unobstructed by contact head 668 and thus may be able to be unloaded from system 10 shown in FIG. 1. The motion range of the body 669 about base 666 generally is no more than needed for loading and unloading of substrate 12. For example, motion range of body 669 about base 666 may be on the order of 50 microns to 1 mm. Alternatively, motion of body 669 about base 666 may exceed necessary requirements for general loading and unloading of substrate 12 depending on design considerations.

As body contacts substrate 12, base 666 may provide an additional force $F_C$ to body 669 for constraining substrate 12 during separation as described herein. In one example, body 669 may be adjustably attached to base 666 to provide a constraining force $F_C$ about the z-axes. For example, contact head 668 may be coupled to base 666 by a vacuum preloaded air bearing, magnetic preloaded air bearing, and/or the like.

Figure 28:
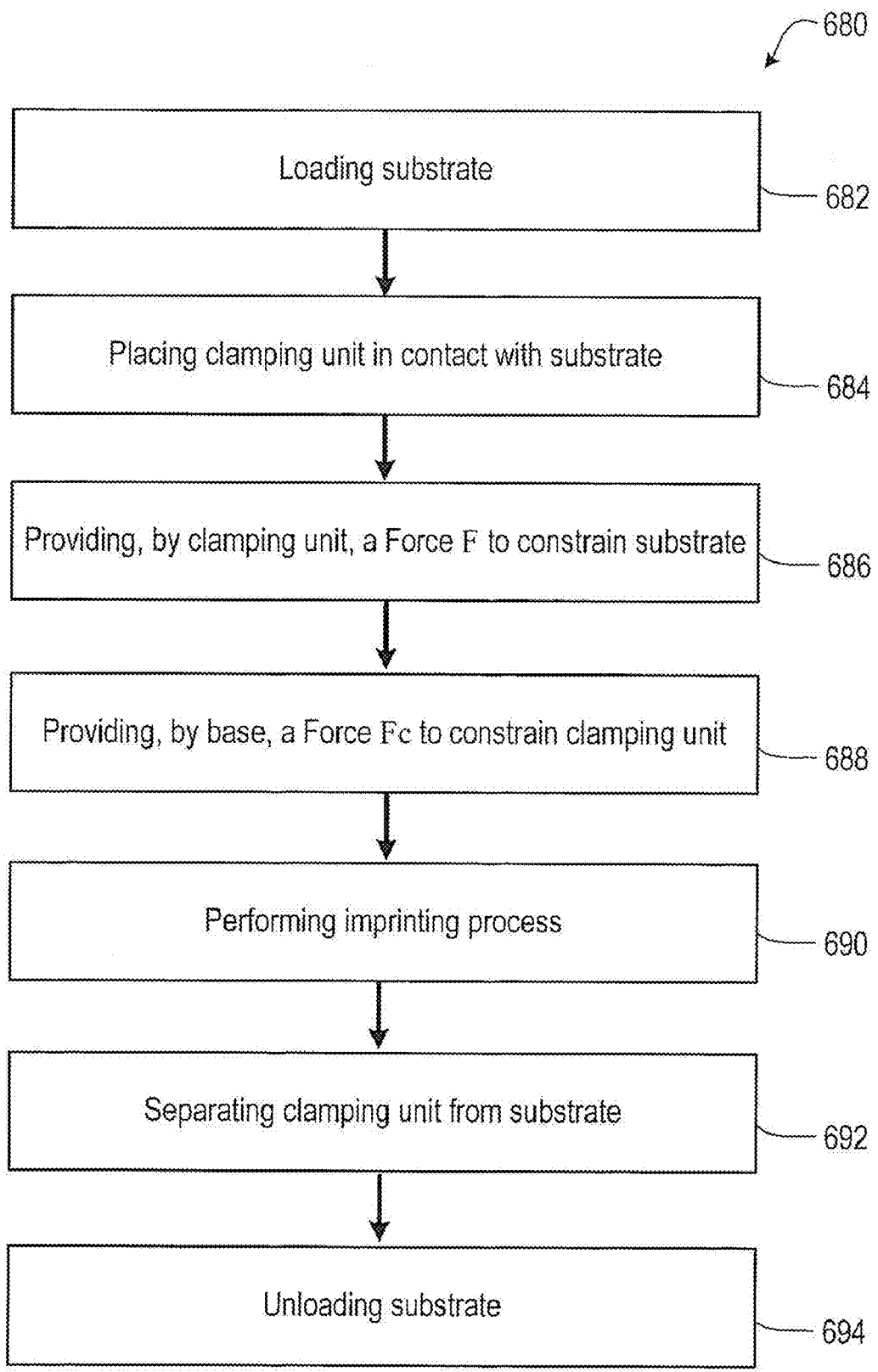
FIG. 28 illustrates a flow chart of an exemplary method for constraining a substrate during separation of a template from the substrate.

FIG. 28 illustrates a flow chart 680 of an exemplary method for constraining substrate 12 during separation of template 18 from substrate 12. In a step 682, substrate 12 may be loaded to system 10. In a step 684, contact head 668 may be placed in contact with substrate 12. For example, surface 670 of contact head 668 may contact chamfered edge 664 of substrate 12. In a step 686, contact head 668 may provide force F constraining substrate 12. In a step 688, base 666 may provide force $F_C$ for constraining body 669. In a step 690, the system 10 may perform the imprinting process. In a step 692, contact head 668 may be separated from substrate 12 by radial motion of body 669 about bass 666. In a step 690, substrate 12 may be unloaded from system 10.

What is claimed is:
1. An apparatus, comprising:
a vacuum chuck adapted to support a substrate, the vacuum chuck having:
an outer land adapted to support an outer diameter of the substrate, the outer land having a first height; and, an inner land spaced apart from the outer land and adapted to support an inner diameter of the substrate, the inner land having a second height less than the first height of the outer land;

wherein the first height and the second height are determined to provide a retained substrate in a single wave formation and to provide a biasing of vacuum force towards the outer diameter of the substrate.

2. The apparatus of claim 1, further comprising a template chuck adapted to support an imprint lithography template, the template chuck having a plurality of lands and throughways forming chambers.

3. The apparatus of claim 2, wherein at least one chamber provides pressure to the imprint lithography template and at least one chamber provides vacuum to the imprint lithography template.

4. The apparatus of claim 3, wherein the chambers are adapted to provide the imprint lithography template in a single wave formation.

5. The apparatus of claim 3, wherein the chambers are adapted to provide the imprint lithography template in a double wave formation.

6. The apparatus of claim 1, wherein the outer land is tapered.

7. The apparatus of claim 1, further comprising a holding system providing a force to the outer diameter of the substrate.

8. The apparatus of claim 7, wherein the holding system includes a contact head having a chamfered edge, the chamfered edge contacting the outer diameter of the substrate.

9. An apparatus for holding a substrate having a chamfered edge angled relative to its surface, comprising:

a holding system adapted to secure the chamfered edge of the substrate, the holding system having a body and a contact head connected to the body and adapted to provide a force to constrain a substrate at its periphery, the contact head having at least one surface positioned at an obtuse angle relative the body such that the surface aligns with and engages the chamfered edge of the substrate thereby avoiding interference of the holding system with the substrate surface.

10. The apparatus of claim 9, further comprising a base adjustably attached to the body, the base providing radial motion of the body about one or more axes.

11. The apparatus of claim 10, wherein the motion range of the body about the base may be between approximately 50 microns and 1 mm.

12. The apparatus of claim 1 wherein the first height is greater than the second height.

13. The apparatus of claim 1 further comprising a first recess between the inner and outer lands.

14. The apparatus of claim 13 wherein the inner land further defines a second recess.

15. The apparatus of claim 9 further comprising a substrate chuck adapted to support the substrate.

16. The apparatus of claim 10 wherein the base is adjustably attached to the body by a preloaded air bearing.

* * * * *